United States Patent
Zhu et al.

(10) Patent No.: US 10,403,195 B2
(45) Date of Patent: Sep. 3, 2019

(54) SHIFT REGISTER, METHOD FOR DRIVING THE SAME, AND DISPLAY DEVICE

(71) Applicant: Shanghai Tianma AM-OLED Co., Ltd., Shanghai (CN)

(72) Inventors: Renyuan Zhu, Shanghai (CN); Yue Li, Shanghai (CN); Yana Gao, Shanghai (CN); Dongxu Xiang, Shanghai (CN); Zeyuan Chen, Shanghai (CN); Bozhang Sun, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 164 days.

(21) Appl. No.: 15/791,137

(22) Filed: Oct. 23, 2017

(65) Prior Publication Data
US 2018/0374410 A1 Dec. 27, 2018

(30) Foreign Application Priority Data
Jun. 27, 2017 (CN) .......................... 2017 1 0499479

(51) Int. Cl.
| | |
|---|---|
| *G11C 19/00* | (2006.01) |
| *G09G 3/20* | (2006.01) |
| *G11C 19/28* | (2006.01) |
| *G11C 19/18* | (2006.01) |
| *G09G 3/36* | (2006.01) |
| *G09G 3/3266* | (2016.01) |

(52) U.S. Cl.
CPC ............. *G09G 3/2092* (2013.01); *G09G 3/20* (2013.01); *G11C 19/18* (2013.01); *G11C 19/28* (2013.01); *G09G 3/3266* (2013.01); *G09G 3/3674* (2013.01); *G09G 3/3677* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 2017/0309211 A1* | 10/2017 | Zhang | ...................... | G09G 3/20 |
| 2018/0068635 A1* | 3/2018 | Zhu | ........................ | G09G 5/006 |
| 2018/0130541 A1* | 5/2018 | Li | ............................ | G09G 5/003 |
| 2018/0254091 A1* | 9/2018 | Zhang | .................. | G11C 19/184 |
| 2018/0357974 A1* | 12/2018 | Zheng | ..................... | G11C 19/28 |
| 2019/0073933 A1* | 3/2019 | Xuan | ........................ | G09G 3/20 |
| 2019/0073949 A1* | 3/2019 | Zhang | .................. | G09G 3/3225 |

FOREIGN PATENT DOCUMENTS

CN 106782663 A 5/2017

* cited by examiner

*Primary Examiner* — Tuan T Lam
(74) *Attorney, Agent, or Firm* — Alston & Bird LLP

(57) ABSTRACT

Embodiments of the disclosure provide a shift register, a method for driving the same, and a display device, and the shift register includes: a first input module and a second input module, connected respectively with an input signal terminal and a first clock signal terminal; a first control module and a second control module connected with a second clock signal terminal; a third control module connected with a first reference signal terminal; and an output module and a plurality of capacitors, connected respectively with the first reference signal terminal, the second reference signal terminal, and the output signal terminal.

16 Claims, 12 Drawing Sheets

--Prior Art--

--Prior Art--

US 10,403,195 B2

SHIFT REGISTER, METHOD FOR DRIVING THE SAME, AND DISPLAY DEVICE

This application claims the benefit of Chinese Patent Application No. CN201710499479.1, filed with the Chinese Patent Office on Jun. 27, 2017, which is hereby incorporated by reference in its entirety.

FIELD OF INVENTION

The present disclosure relates to the field of computer technologies, and particularly to a shift register, a method for driving the same, and a display device.

BACKGROUND

As display screens are being developed constantly, there is an increasing demand from consumers for the stability of the display screens. The stability of the display screens is significantly dependent on gate driver circuits, and shift registers constituting the gate driver circuits.

At present, a shift register is generally structured in 5T2C (that is, it includes five switching transistors and two capacitors). As illustrated in FIG. 1 which is a schematic structural diagram of a shift register in the prior art, all of the first switching transistor M1 to the fifth switching transistor M5 are P-type thin film transistors. As illustrated in FIG. 2 which is a scheme timing diagram thereof, when a low-level signal is output at an output signal terminal OUT, the third switching transistor M3 is turned-on due to the low-level signal output by the output signal terminal OUT, and at this time, a high-level signal output at a first reference signal terminal VGH is transmitted to a first node N1 due to the third switching transistor M3 which is turned-on. The fifth switching transistor M5 is turned-off due to the high-level signal at the first node N1. If there is not a low-level signal to be written in a timely manner into the first node N1 being persistent in the high-level state, then there will be an abnormal output at the output signal terminal OUT, thus resulting in a risk of contention in the scheme, and making the shift register instable.

In view of this, there is highly desirable at present to provide such a stable shift register and gate driver circuit that can enable a normal output at an output terminal thereof while guaranteeing the stability thereof.

BRIEF SUMMARY

Embodiments of the disclosure provide a shift register, a method for driving the same, and a display device so as to address the problem of an instable output in the shift register in the prior art.

A shift register according to an embodiment of the disclosure includes: a first input module, a second input module, a first control module, a second control module, a third control module, an output module, a first coupling module, a second coupling module, a third coupling module, and a fourth coupling module, wherein: the first input module is electrically connected with an input signal terminal and a first clock signal terminal, and configured to be controlled by the first clock signal terminal to transmit an input signal input at the input signal terminal to a first node; the second input module is electrically connected with the input signal terminal and the first clock signal terminal, and configured to be controlled by the input signal terminal to transmit a first clock signal input at the first clock signal terminal to a second node; the first control module is electrically connected with a second clock signal terminal, and configured to be controlled by the second node to transmit a second clock signal input at the second clock signal terminal to a third node; the second control module is electrically connected with the second clock signal terminal, and configured to be controlled by both the first node and the second clock signal terminal to transmit either the second clock signal input at the second clock signal terminal or the electric potential of the first node to a fourth node; the third control module is electrically connected with a first reference signal terminal, and configured to be controlled by the third node to transmit a first reference signal input at the first reference signal terminal to the fourth node; the output module is electrically connected with the first reference signal terminal, a second reference signal terminal, and an output signal terminal, and configured to be controlled by the third node and the fourth node to transmit the first reference signal input at the first reference signal terminal, or a second reference signal input at the reference signal terminal to the output signal terminal; the first coupling module includes a first capacitor electrically connected with the second node, and configured to stable the electric potential of the second node; the second coupling module includes a second capacitor electrically connected with the first node and the second control module, and configured to stabilize the electric potential of the first node; the third coupling module includes a third capacitor electrically connected with the third node and the first reference signal terminal, and configured to stabilize the electric potential of the third node; and the fourth coupling module includes a fourth capacitor electrically connected with the fourth node and the second reference signal terminal, and configured to stabilize the electric potential of the fourth node.

In another aspect, an embodiment of the disclosure further provides a method for driving the shift register as described above, the method including: a first stage of providing the input signal terminal and the first clock signal terminal with a first level signal, and the second clock signal terminal with a second level signal, and outputting the second level signal at the output signal terminal; a second stage of providing the input signal terminal and the second clock signal terminal with the first level signal, and the first clock signal terminal with the second level signal, and outputting the first level signal at the output signal terminal; a third stage of providing the input signal terminal and the second clock signal terminal with the second level signal, and the first clock signal terminal with the first level signal, and outputting the first level signal at the output signal terminal; a fourth stage of providing the input signal terminal and the first clock signal terminal with the second level signal, and the second clock signal terminal with the first level signal, and outputting the second level signal at the output signal terminal; and a fifth stage of providing the input signal terminal and the second clock signal terminal with the second level signal, and the first clock signal terminal with the first level signal, and outputting the second level signal at the output signal terminal.

In another aspect, an embodiment of the disclosure further provides a method for driving the shift register as described above, the method including: a first stage of providing the first clock signal terminal with a first level signal, and the input signal terminal and the second clock signal terminal with a second level signal, and outputting the first level signal at the output signal terminal; a second stage of providing the second clock signal terminal with the first level signal, and the input signal terminal and the first clock signal terminal with the second level signal, and outputting the second level signal at the output signal terminal; a third stage of providing the second clock signal terminal with the second level signal, and the input signal terminal and the first clock signal terminal with the first level signal, and outputting the second level signal at the output signal terminal; a fourth stage of providing the first clock signal terminal with the second level signal, and the input signal terminal and the second clock signal terminal with the first level signal, and outputting the first level signal at the output signal terminal; and a fifth stage of providing the second clock signal terminal with the second level signal, and the input signal terminal and the first clock signal terminal with the first level signal, and outputting the first level signal at the output signal terminal.

DETAILED DESCRIPTION OF THE EMBODIMENTS

Figure 1:
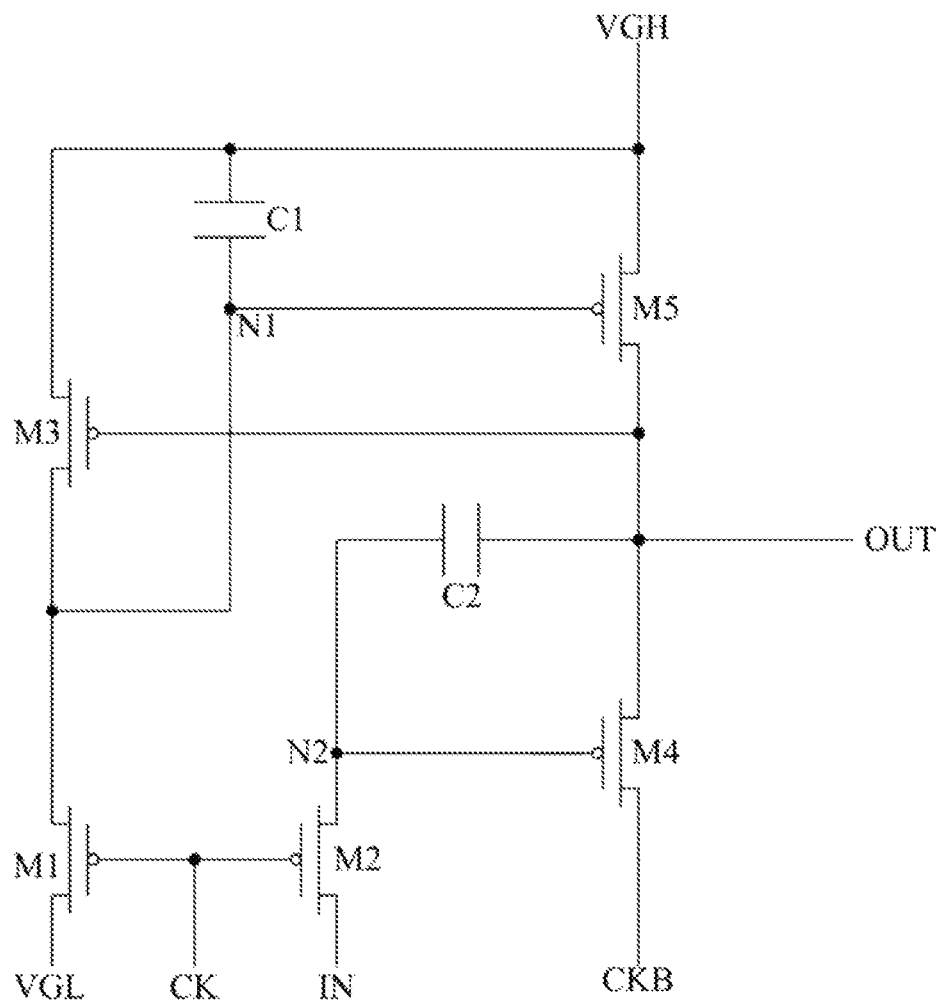
FIG. 1 is a schematic particular structural diagram of a shift register in the prior art.
Figure 2:
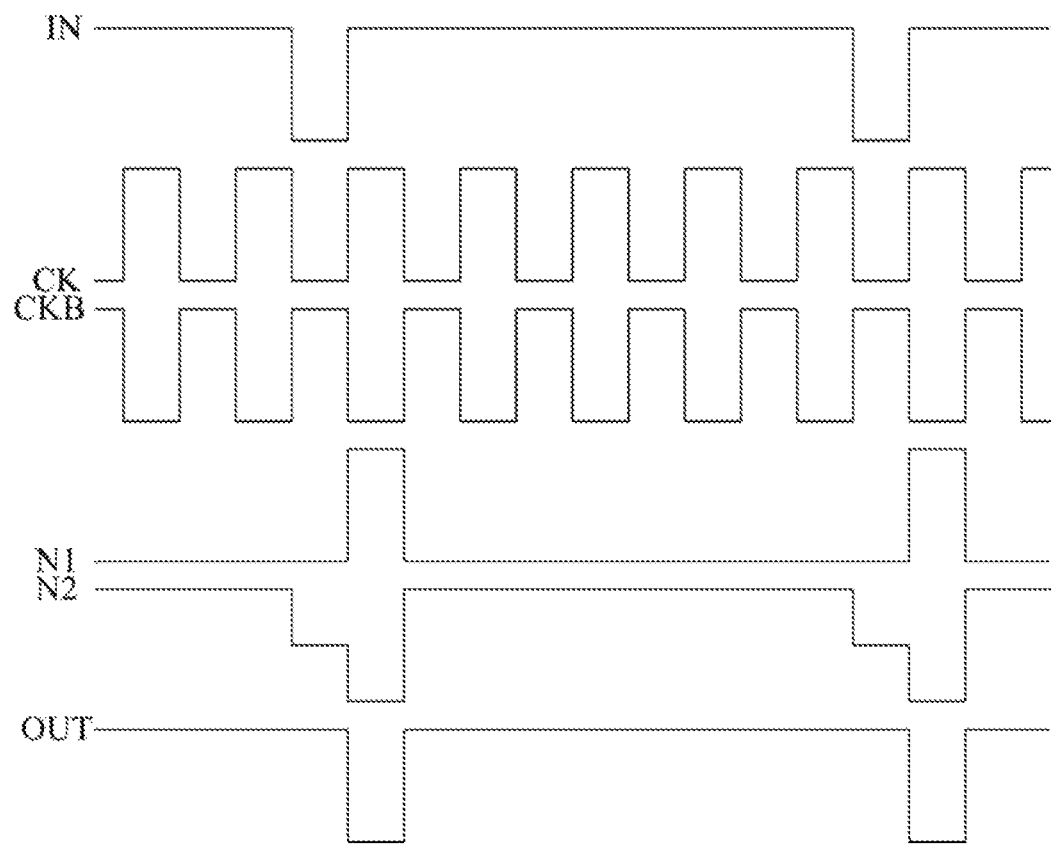
FIG. 2 is an input-output timing diagram corresponding to the shift register in the prior art.
Figure 3:
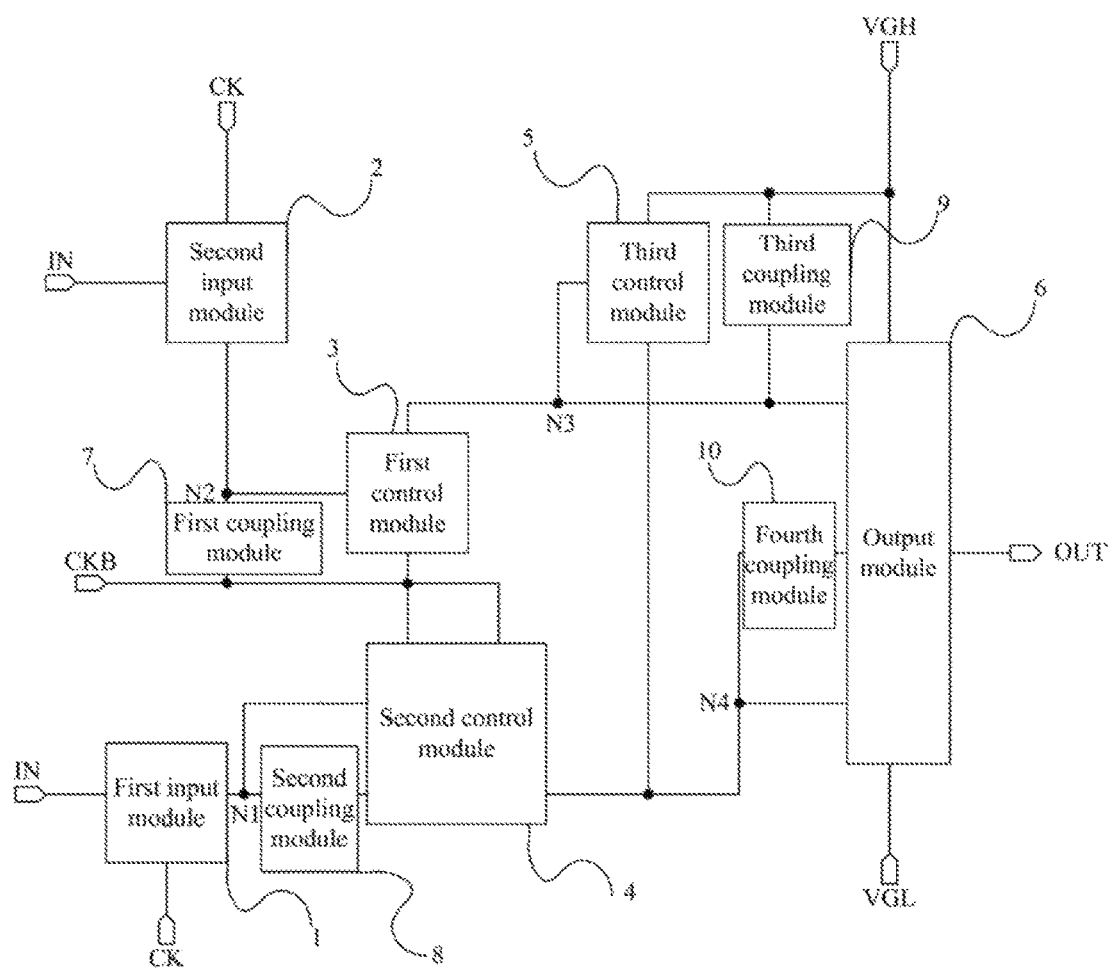
FIG. 3 is a schematic structural diagram of a shift register according to an embodiment of the disclosure.

In order to make the objects, technical solutions, and advantages of the disclosure more apparent, a shift register, a method for driving the shift register, and a display device according to embodiments of the disclosure will be described below in details with reference to the drawings. It shall be noted that the preferred embodiments to be described below are merely intended to illustrate and describe the disclosure, but not to limit the disclosure. Moreover the embodiments according to the disclosure, and features in the embodiments can be combined with each other unless they conflict with each other.

As illustrated in FIG. 3 to FIG. 8, a shift register according to embodiments of the disclosure includes a first input module 1, a second input module 2, a first control module 3, a second control module 4, a third control module 5, an output module 6, a first coupling module 7, a second coupling module 8, a third coupling module 9, and a fourth coupling module 10.

The first input module 1 is electrically connected with an input signal terminal IN and a first clock signal terminal CK, and configured to be controlled by the first clock signal terminal CK to transmit an input signal input at the input signal terminal IN to a first node N1.

The second input module 2 is electrically connected with the input signal terminal IN and the first clock signal terminal CK, and configured to be controlled by the input signal terminal IN to transmit a first clock signal input at the first clock signal terminal CK to a second node N2.

The first control module 3 is electrically connected with a second clock signal terminal CKB, and configured to be controlled by the second node N2 to transmit a second clock signal input at the second clock signal terminal CKB to a third node N3.

The second control module 4 is electrically connected with the second clock signal terminal CKB, and configured to be controlled by the first node N1 and the second clock signal terminal CKB to transmit the second clock signal input at the second clock signal terminal CKB, or the electric potential of the first node N1 to a fourth node N4.

The third control module 5 is electrically connected with a first reference signal terminal VGH, and configured to be controlled by the third node N3 to transmit a first reference signal input at the first reference signal terminal VGH to the fourth node N4.

The output module 6 is electrically connected with the first reference signal terminal VGH, a second reference signal terminal VGL, and an output signal terminal OUT, and configured to be controlled by the third node N3 and the fourth node N4 to transmit the first reference signal input at the first reference signal terminal VGH, or a second reference signal input at the reference signal terminal VGL to the output signal terminal OUT.

The first coupling module 7 includes a first capacitor C1 electrically connected with the second node N2, and configured to stabilize the electric potential of the second node C2.

The second coupling module 8 includes a second capacitor C2 electrically connected with the first node N1 and the second control module 4, and configured to stabilize the electric potential of the first node N1.

The third coupling module 9 includes a third capacitor C3 electrically connected with the third node N3 and the first reference signal terminal VGH, and configured to stabilize the electric potential of the third node N3.

The fourth coupling module 10 includes a fourth capacitor C4 electrically connected with the fourth node N4 and the second reference signal terminal VGL, and configured to stabilize the electric potential of the fourth node N4.

Particularly the shift register according to the embodiments of the disclosure can take a high/low-level trigger signal as an input signal, and have its output signals shifted flexibly, and can have the output signals overlap with each other; and he shift register can operate as either a scan driver circuit or a light-emitting driver circuit for high applicability to a number of driver modes. The two clock signals are transmitted respectively to the third node N3 and the fourth node N4 at an interval of half a cycle to have their electric potentials rewritten, and the electric potentials of the nodes are maintained by the capacitors in the other period of time, thus enabling an output waveform to be output in a stable manner, and the scheme of the shift register to operate in a stable manner. As a result, there may be a larger process window using the two clock signals, thus enabling a normal output despite serious drifting of a threshold thereof.

In an embodiment, in the shift register according to the embodiments of the disclosure, as illustrated in FIG. 4 to FIG. 8, the first input module 1 can include a first switching transistor T1 with a gate electrically connected with the first clock signal terminal CK, a source electrically connected with the input signal terminal IN, and a drain electrically connected with the first node N1. Particularly the first switching transistor T1 is controlled by the first clock signal terminal CK and can be turned-on to provide the first node N1 with the input signal input at the input signal terminal IN.

Figure 6:
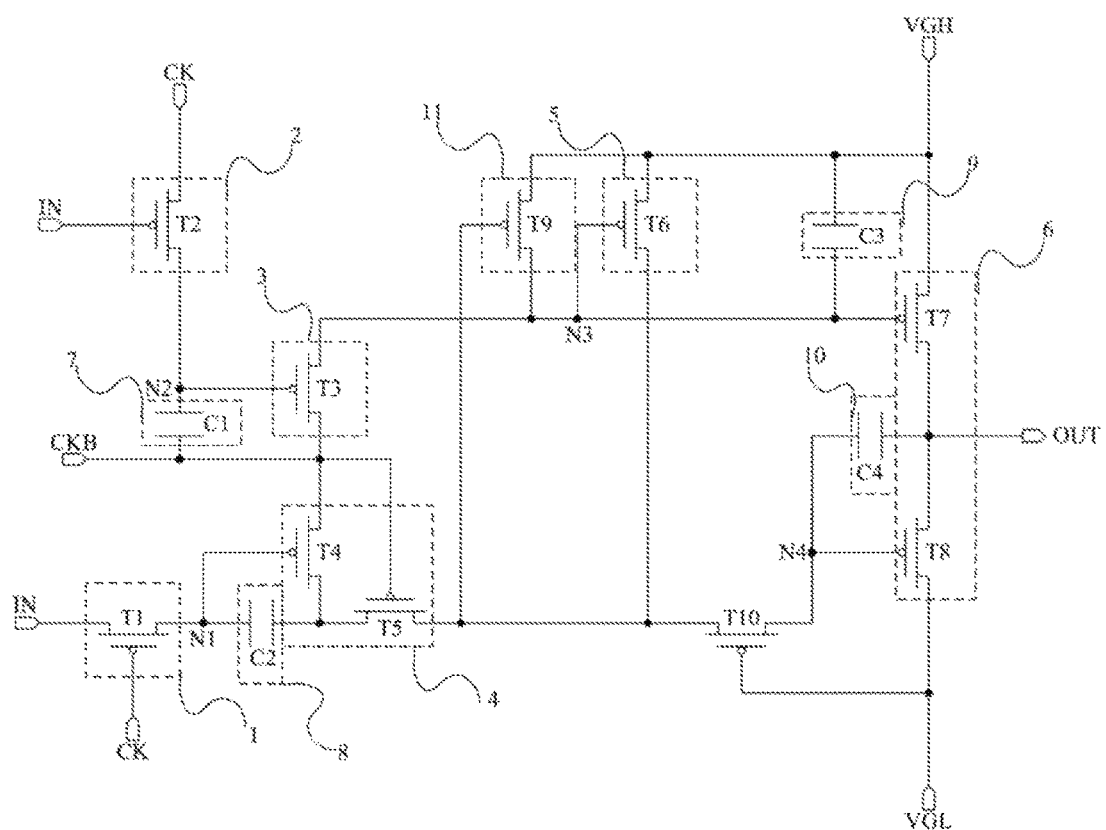
FIG. 6 is a third schematic particular structural diagram of a shift register according to an embodiment of the disclosure.
Figure 7:
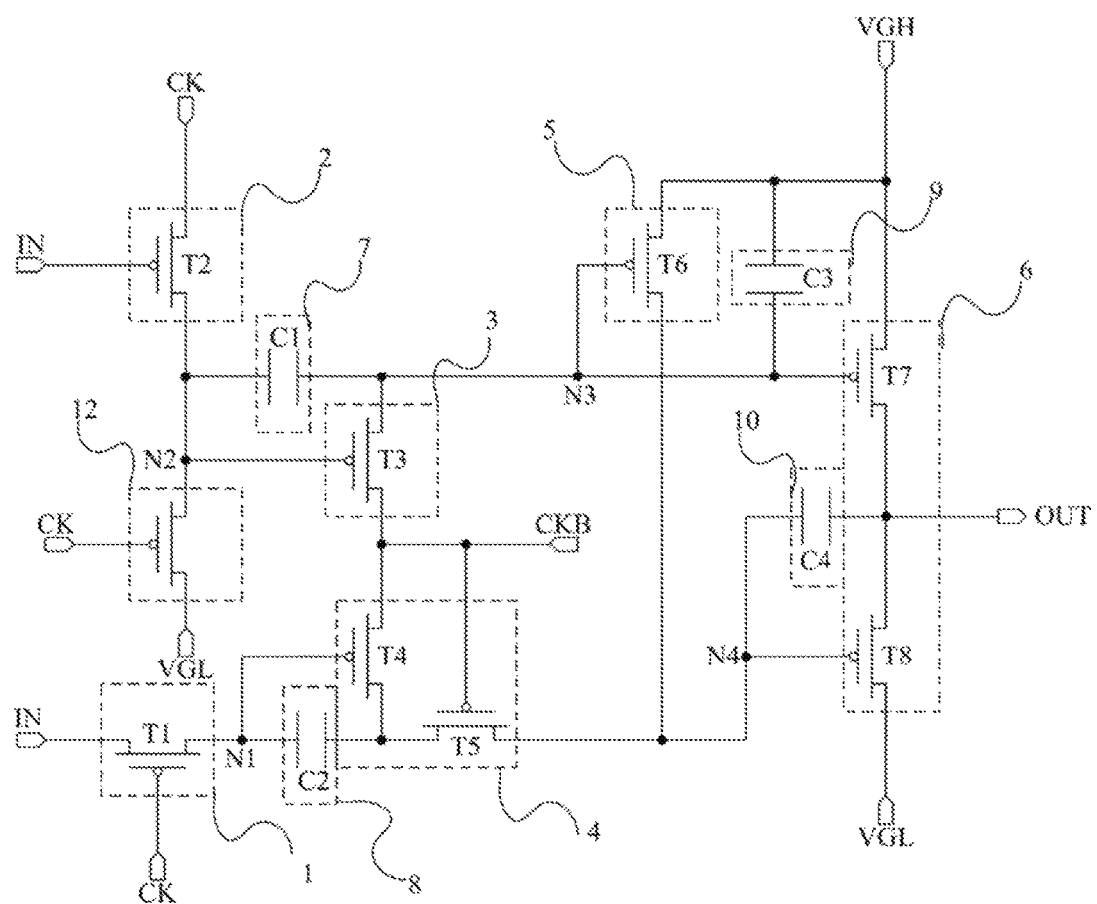
FIG. 7 is a fourth schematic particular structural diagram of a shift register according to an embodiment of the disclosure.
Figure 8:
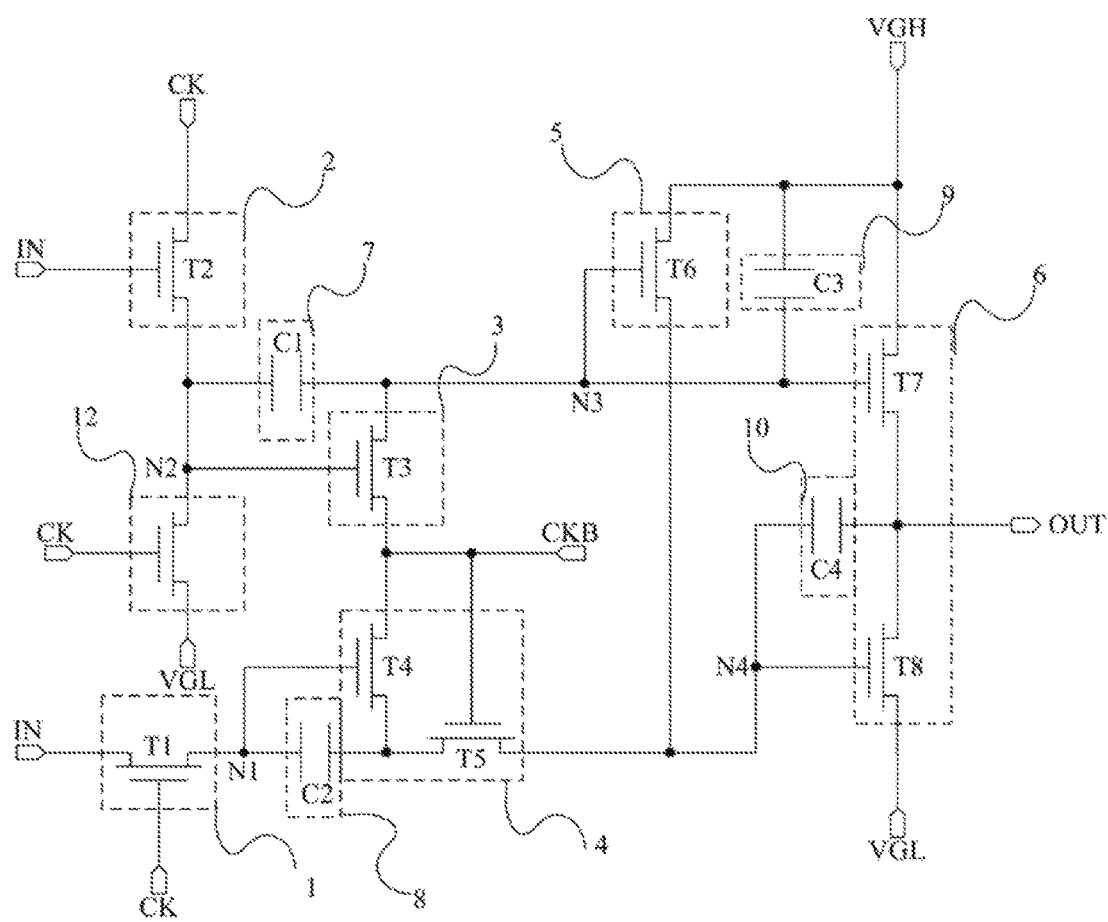
FIG. 8 is a fifth schematic particular structural diagram of a shift register according to an embodiment of the disclosure.

Particularly in the shift register according to the embodiments of the disclosure, as illustrated in FIG. 4 to FIG. 7, the first switching transistor T1 may be a P-type transistor; or as illustrated in FIG. 8, the first switching transistor T1 may be an N-type transistor, although the embodiments of the disclosure will not be limited thereto.

In an embodiment, in the shift register according to the embodiments of the disclosure, as illustrated in FIG. 4 to FIG. 8, the second input module 2 can include a second switching transistor T2 with a gate electrically connected with the input signal terminal IN, a source electrically connected with the first clock signal terminal CK, and a drain electrically connected with the second node N2. Particularly the second switching transistor T2 is controlled by the input signal terminal IN to be turned-on to provide the second node N2 with the first clock signal input at the first clock signal terminal CK.

In an embodiment, in the shift register according to the embodiments of the disclosure, as illustrated in FIG. 4 to FIG. 7, the second switching transistor T2 may be a P-type transistor; or as illustrated in FIG. 8, the second switching transistor T2 may be an N-type transistor, although the embodiments of the disclosure will not be limited thereto.

In an embodiment, in the shift register according to the embodiments of the disclosure, as illustrated in FIG. 4 to FIG. 8, the first control module 3 can include a third switching transistor T3 with a gate electrically connected with the second node N2, a source electrically connected with the second clock signal terminal CKB, and a drain electrically connected with the third node N3. Particularly the third switching transistor T3 is controlled by the second node N2 to be turned-on to provide the third node N3 with the second clock signal input at the second clock signal terminal CKB.

In an embodiment, in the shift register according to the embodiments of the disclosure, as illustrated in FIG. 4 to FIG. 7, the third switching transistor T3 may be a P-type transistor; or as illustrated in FIG. 8, the third switching transistor T3 may be an N-type transistor, although the embodiments of the disclosure will not be limited thereto.

In an embodiment, in the shift register according to the embodiments of the disclosure, as illustrated in FIG. 4 to FIG. 8, the second control module 4 can include a fourth switching transistor T4 and a fifth switching transistor T5.

The fourth switching transistor T4 has a gate electrically connected with the first node N1, a source electrically connected respectively with the second clock signal terminal CKB and a gate of the fifth switching transistor T5, and a drain electrically connected respectively with a first electrode of the second capacitor C2, and a source of the fifth switching transistor T5.

The fifth switching transistor T5 has a drain electrically connected with the fourth node N4.

The second capacitor C2 has a second electrode electrically connected with the first node N1.

Particularly the fourth switching transistor T4 is controlled by the first node N1 to be turned-on to provide the first electrode of the second capacitor C2, and the source of the fifth switching transistor T5 with the second clock signal input at the second clock signal terminal CKB. The fifth switching transistor T5 is controlled by the second clock signal terminal CKB to be turned-on to provide the fourth node N4 with the second clock signal input at the second clock signal terminal CKB. While the first node N1 is floating, the voltage across the second capacitor C2 can be stabilized due to the bootstrap of the second capacitor C2, that is, the difference in voltage between the first node N1, and the source of the fifth switching transistor T5 can be stabilized.

In an embodiment, in the shift register according to the embodiments of the disclosure, as illustrated in FIG. 4 to FIG. 7, the fourth switching transistor T4 and the fifth switching transistor T5 may be P-type transistors; or as illustrated in FIG. 8, the fourth switching transistor T4 and the fifth switching transistor may be N-type transistors, although the embodiments of the disclosure will not be limited thereto.

In an embodiment, in the shift register according to the embodiments of the disclosure, as illustrated in FIG. 4 to FIG. 8, the third control module 5 can include a sixth switching transistor T6 with a gate electrically connected with the third node N3, a source electrically connected with the first reference signal terminal VGH, and a drain electrically connected with the fourth node N4. Particularly the sixth switching transistor T6 is controlled by the third node N3 to be turned-on to provide the fourth node N4 with the first reference signal input at the first reference signal terminal VGH.

In an embodiment, in the shift register according to the embodiments of the disclosure, as illustrated in FIG. 4 to FIG. 7, the sixth switching transistor T6 may be a P-type transistor; or as illustrated in FIG. 8, the sixth switching transistor T6 may be an N-type transistor, although the embodiments of the disclosure will not be limited thereto.

In an embodiment, in the shift register according to the embodiments of the disclosure, as illustrated in FIG. 4 to FIG. 8, the output module 6 can include a seventh switching transistor T7 and an eighth switching transistor T8.

The seventh switching transistor T7 has a gate electrically connected with the third node N3, a source electrically connected with the first reference signal terminal VGH, and a drain electrically connected respectively with a drain of the eighth transistor T8, and the output signal terminal OUT.

The eighth transistor T8 has a gate electrically connected with the fourth node N4, and a source electrically connected with the second reference signal terminal VGL.

Particularly the seventh switching transistor T7 is controlled by the third node N3 to be turned-on to provide the output signal terminal OUT with the first reference signal input at the first reference signal terminal VGH. The eighth switching transistor T8 is controlled by the fourth node N4 to be turned-on to provide the output signal terminal OUT with the second reference signal input at the second reference signal terminal VGL. Moreover since the third capacitor C3 is connected between the gate and the source of the seventh switching transistor T7, while the third node N3 is floating, the voltage across the third capacitor C3 can be stabilized due to the bootstrap of the third capacitor C3, that is, the difference in voltage between the third node N3, i.e., the gate of the seventh switching transistor T7, and the source of the seventh switching transistor T7 can be stabilized. Similarly, since the fourth capacitor C4 is connected between the gate and the drain of the eighth switching transistor T8, while the fourth node N4 is floating, the voltage across the fourth capacitor C4 can be stabilized due to the bootstrap of the fourth capacitor C4, that is, the difference in voltage between the fourth node N4, i.e., the gate of the eighth switching transistor T8, and the drain of the eighth switching transistor T8 can be stabilized.

In an embodiment, in the shift register according to the embodiments of the disclosure, as illustrated in FIG. 4 to FIG. 7, the seventh switching transistor T7 and the eighth switching transistor T8 may be P-type transistors; or as illustrated in FIG. 8, the seventh switching transistor T7 and the eighth switching transistor T8 may be N-type transistors, although the embodiments of the disclosure will not be limited thereto.

In an embodiment, in the shift register according to the embodiments of the disclosure, as illustrated in FIG. 3 to FIG. 6, the first electrode of the first capacitor C1 can be electrically connected with the second node N2, and the second electrode of the first capacitor C1 can be electrically connected with the second clock signal terminal CKB. While the second node N2 is floating, the voltage across the first capacitor C1 can be stabilized due to the bootstrap of the first capacitor C1, that is, the difference in voltage between the second node N2 and the second clock signal terminal CKB can be stabilized.

Figure 4:
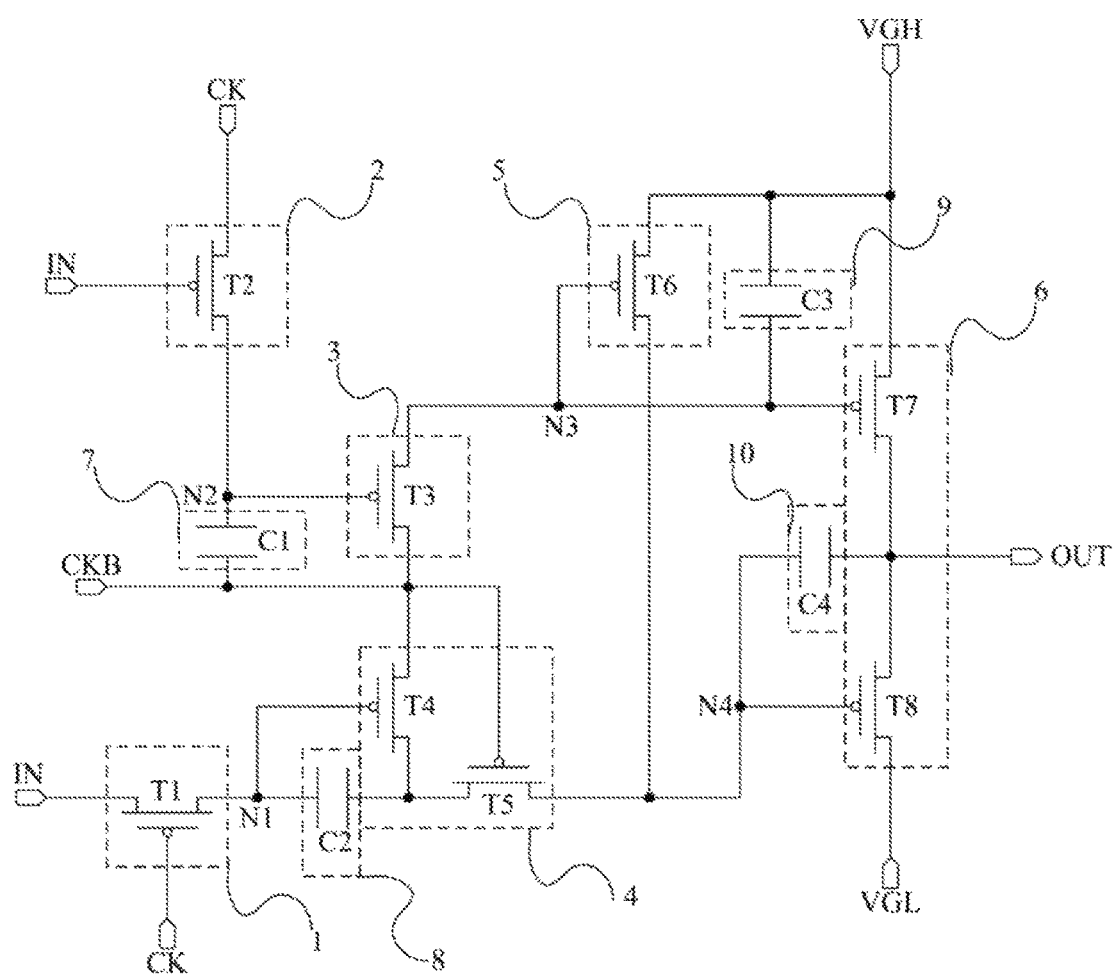
FIG. 4 is a first schematic particular structural diagram of a shift register according to an embodiment of the disclosure.
Figure 5:
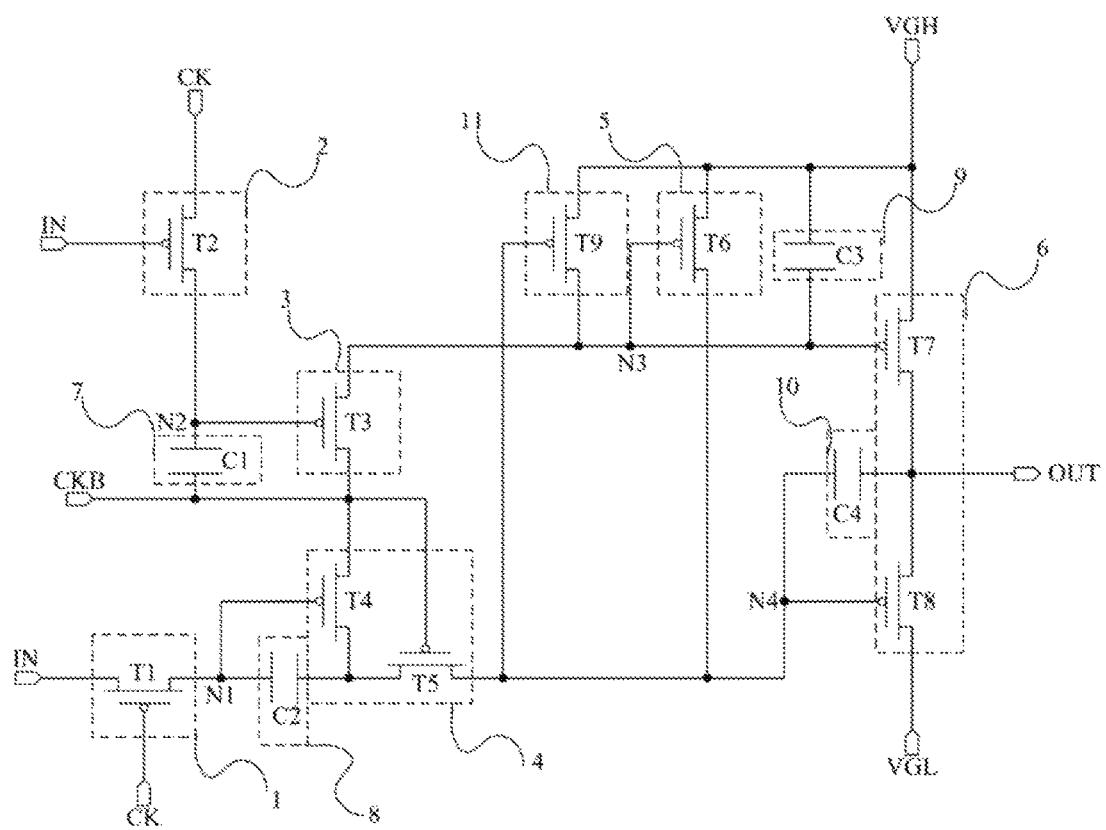
FIG. 5 is a second schematic particular structural diagram of a shift register according to an embodiment of the disclosure.

In an embodiment, further to the shift register according to the embodiments of the disclosure structured as illustrated in FIG. 4, in order to shorten a period of time in which the third node N3 is floating, to thereby enable the scheme to output in a more stable manner, the shift register according to the embodiments of the disclosure as illustrated in FIG. 5 and FIG. 6 can further include a fourth control module 11.

The fourth control module 11 is electrically connected with the first reference signal terminal VGH, and configured to be controlled by the fourth node N4 to transmit the first reference signal input at the first reference signal terminal VGH to the third node N3.

In an embodiment, in the shift register according to the embodiments of the disclosure, as illustrated in FIG. 5 and FIG. 6, the fourth control module 11 can include a ninth switching transistor T9 with a gate electrically connected with the fourth node N4, a source electrically connected with the first reference signal terminal VGH, and a drain electrically connected with the third node N3. Particularly the ninth switching transistor T9 is controlled by the fourth node N4 to be turned-on to provide the third node N3 with the first reference signal input at the first reference signal terminal VGH.

In an embodiment, in the shift register according to the embodiments of the disclosure, as illustrated in FIG. 5 and FIG. 6, the ninth switching transistor T9 may be a P-type transistor; or the ninth switching transistor T9 may be an N-type transistor, although the embodiments of the disclosure will not be limited thereto.

In an embodiment, further to the shift register according to the embodiments of the disclosure structured as illustrated in FIG. 4 and FIG. 5, in order to alleviate leakage current flowing into the fourth node N4, and to mitigate the voltage across the source and the drain of the sixth switching transistor T6 to thereby prevent the sixth switching transistor T6 from failing, and improve the stability of the scheme, the shift register according to the embodiment of the disclosure as illustrated in FIG. 6 can further include a tenth switching transistor T10 with a gate electrically connected with the second reference signal terminal VGL, a source electrically connected respectively with the second control module 4, the third control module 5, and the fourth control module 11, and a drain electrically connected with the fourth node N4.

Particularly since the tenth switching transistor T10 is controlled by the second reference signal terminal VGL to be kept turned-on, the tenth switching transistor T10 can equivalently be a resistor to filter leakage current flowing into the fourth node N4; and the tenth switching transistor T10 can have the voltage at the source of the tenth switching transistor T10 higher than the voltage at the drain thereof to thereby lower the voltage across the source and the drain of the sixth switching transistor T6 so as to prevent the sixth switching transistor T6 from failing, and to improve the stability of the scheme.

In an embodiment, in the shift register according to the embodiments of the disclosure, as illustrated in FIG. 6, the tenth switching transistor T10 may be a P-type transistor; or the tenth switching transistor T10 may be an N-type transistor, although the embodiments of the disclosure will not be limited thereto.

In an embodiment, further to the shift register according to the embodiments of the disclosure structured as illustrated in FIG. 4, in order to shorten a period of time in which the second node N2 is floating, to thereby make the scheme more stable, the shift register according to the embodiments of the disclosure as illustrated in FIG. 7 and FIG. 8 can further include a fifth control module 12.

Where the first capacitor C1 has a first electrode electrically connected with the second node N2, and a second electrode electrically connected with the third node N3.

The fifth control module 12 is electrically connected respectively with the first clock signal terminal CK and the second reference signal terminal VGL, and configured to be controlled by the first clock signal terminal CK to transmit the second reference signal input at the second reference signal terminal VGL to the second node N2.

In an embodiment, in the shift register according to the embodiments of the disclosure, as illustrated in FIG. 7 and FIG. 8, the fifth control module 12 can include an eleventh switching transistor T11 with a gate electrically connected with the first clock signal terminal CK, a source electrically connected with the second reference signal terminal VGL, and a drain electrically connected with the second node N2. Particularly the eleventh switching transistor T11 is controlled by the first clock signal terminal CK to be turned-on to provide the second node N2 with the second reference signal input at the second reference signal terminal.

In an embodiment, in the shift register according to the embodiments of the disclosure, as illustrated in FIG. 7, the eleventh switching transistor T11 may be a P-type transistor; or as illustrated in FIG. 8, the eleventh switching transistor T11 may be an N-type transistor, although the embodiments of the disclosure will not be limited thereto.

The particular structures of the respective modules in the shift register according to the embodiments of the disclosure have been described above only by way of an example, and the disclosure will not be limited thereto. This disclosure may include other structures known to those skilled in the art, so the embodiments of the disclosure will not be limited thereto.

In an embodiment, in the shift register according to the embodiment of the disclosure, all the switching transistors are typically embodied as switching transistors made of the same material. In an embodiment, as illustrated in FIG. 4 to FIG. 7, all the switching transistors may be P-type transistors; or as illustrated in FIG. 8, all the switching transistors may be N-type transistors, although the embodiment of the disclosure will not be limited thereto.

In an embodiment, a P-type transistor is turned-off at a high electric potential, and turned-on at a low electric potential; and an N-type transistor is turned-off at a low electric potential, and turned-on at a high electric potential.

In an embodiment, in the shift register according to the embodiments of the disclosure, the cycle of the first clock signal input at the first clock signal terminal CK is the same as the cycle of the second clock signal input at the second clock signal terminal CKB, and their duty cycles are the same. If all the switching transistors in the shift register are P-type transistors, then the first reference signal input at the first reference signal terminal VGH may be at a high electric potential, and the second reference signal input at the second reference signal terminal VGL may be at a low electric potential. Alternatively, if all the switching transistors in the shift register are N-type transistors, then the first reference signal input at the first reference signal terminal VGH may be at a low electric potential, and the second reference signal input at the second reference signal terminal VGL may be at a high electric potential.

It shall be noted that the driver transistor and the switching transistor as referred to in the embodiments above of the disclosure may be Thin Film Transistors (TFTs), or may be Metal Oxide Semiconductor Field Effect Transistors (MOS-FETs), although the embodiments of the disclosure will not be limited thereto. In an embodiment, the sources and the drains of these transistors may be replaced with each other instead of being distinguished from each other. The particular embodiments have been described above by way of an example in which both the driver transistor and the switching transistor are thin film transistors.

An operating process of the shift register according to the embodiments of the disclosure will be described below in details in connection with scheme timing diagrams thereof taking the structures of the shift register as illustrated in FIG. 4 to FIG. 8 respectively as an example. In the following description, 1 represents a high-level signal, and 0 represents a low-level signal, where 1 and 0 represent logic levels, and are only intended to better illustrate an operating process of the shift register according to the embodiments of the disclosure, but not to suggest any electric potentials applied to the gates of the respective switching transistors in a particular implementation.

First Embodiment

Figure 9A:
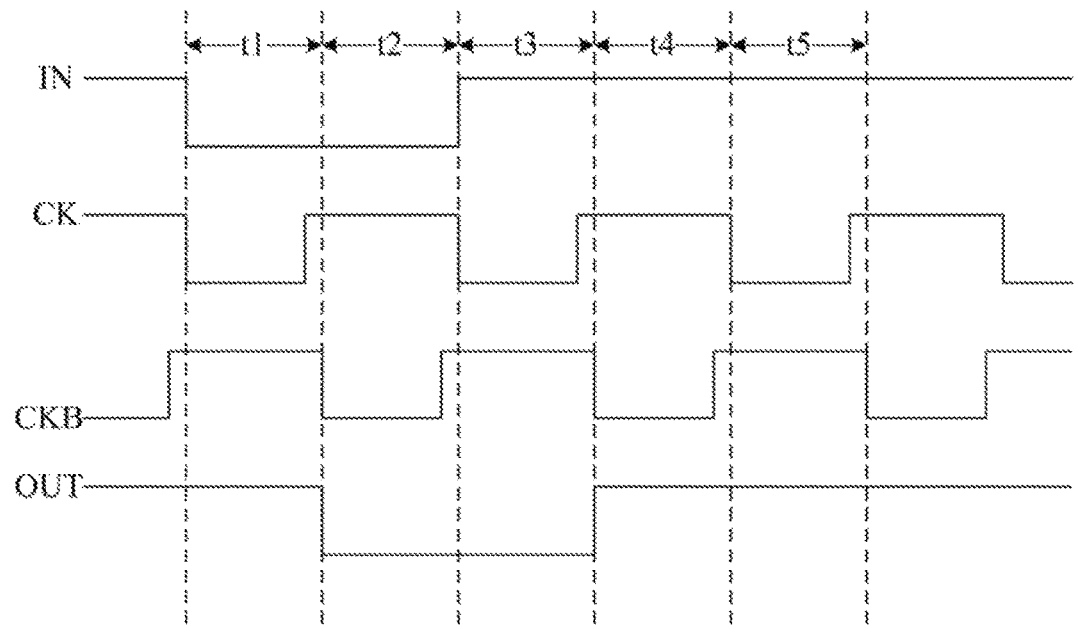
FIG. 9A is an input-output timing diagram corresponding to a shift register according to an embodiment of the disclosure.

Taking the structure of the shift register as illustrated in FIG. 4 as an example, the electric potential of the first reference signal terminal VGH is a high electric potential, and the electric potential of the second reference signal terminal VGL is a low electric potential. FIG. 9A illustrates a corresponding input-output timing diagram thereof, and particularly five stages including a first stage, a second stage, a third stage, a fourth stage, and a fifth stage in the input-output timing diagram as illustrated in FIG. 9A.

In the first stage t1, i.e., an initialization stage, initially IN=0, CK=0, and CKB=1.

An initialized electric potential of the first node N1 is a high electric potential, an initialized electric potential of the second node N2 is a low electric potential, an initialized electric potential of the third node N3 is a high electric potential, and an initialized electric potential of the fourth node N4 is a high electric potential.

When CK=0, the first switching transistor T1 is turned-on to provide the first node N1 with the low-level signal of the input signal terminal IN so that the first node N1 is at a low electric potential. With the first node N1 at a low electric potential, the fourth switching transistor T4 is turned-on to provide the drain of the fourth switching transistor T4, the first electrode of the second capacitor C2, and the source of the fifth switching transistor T5 with the high-level signal of the second clock signal terminal CKB to charge the second capacitor C2. When IN=0, the second switching transistor T2 is turned-on to provide the second node N2 with the low-level signal of the first clock signal terminal CK so that the second node N2 is at a low electric potential. With the second node N2 at a low electric potential, the third switching transistor T3 is turned-on to provide the third node N3 with the high-level signal of the second clock signal terminal CKB so that the third node N3 is at a high electric potential. With the third node N3 at a high electric potential, the sixth switching transistor T6 and the seventh switching transistor T7 are turned-off. When CKB=1, the fifth switching transistor T5 is turned-off so that the fourth node N4 is floating; and the fourth node N4 remains at a high electric potential due to the bootstrap of the fourth capacitor C4, so that the eighth switching transistor T8 is turned-off. As a result, a high-level signal is kept being output at the output signal terminal OUT.

Thereafter IN=0, CK=1, and CKB=1.

When CK=1, the first switching transistor T1 is turned-off so that the first node N1 is floating. The first node N1 remains at a low electric potential due to the bootstrap of the second capacitor C2, so that the fourth switching transistor T4 remains turned-on. When IN=0, the second switching transistor T2 is turned-on to provide the second node N2 with the high-level signal of the first clock signal terminal CK so that the second node N2 is at a high electric potential. With the second node N2 at a high electric potential, the third switching transistor T3 is turned-off so that the third node N3 is floating. The third node N3 remains at a high electric potential due to the bootstrap of the third capacitor C3, so that the sixth switching transistor T6 and the seventh switching transistor T7 are turned-off. When CKB=1, the fifth switching transistor T5 is turned-off so that the fourth node N4 is floating; and the fourth node N4 remains at a high electric potential due to the bootstrap of the fourth capacitor C4, so that the eighth switching transistor T8 is turned-off. As a result, a high-level signal is kept being output at the output signal terminal OUT.

In the second stage t2, i.e., a shift stage, initially IN=0, CK=1, and CKB=0.

When CK=1, the first switching transistor T1 is turned-off so that the first node N1 is floating. The first node N1 remains at a low electric potential due to the bootstrap of the second capacitor C2, so that the fourth switching transistor T4 remains turned-on to provide the drain of the fourth switching transistor T4, the first electrode of the second capacitor C2, and the source of the fifth switching transistor T5 with the low-level signal of the second clock signal terminal CKB to discharge the second capacitor C2. When IN=0, the second switching transistor T2 is turned-on to provide the second node N2 with the high-level signal of the first clock signal terminal CK so that the second node N2 is at a high electric potential. With the second node N2 at a high electric potential, the third switching transistor T3 is turned-off so that the third node N3 is floating. The third node N3 remains at a high electric potential due to the bootstrap of the third capacitor C3, so that the sixth switching transistor T6 and the seventh switching transistor T7 are turned-off. When CKB=0, the fifth switching transistor T5 is turned-on to provide the fourth node N4 with the low-level signal of the second clock signal terminal CKB through the fourth switching transistor T4 so that the fourth node N4 is at a low electric potential. With the fourth node N4 at a low electric potential, the eighth switching transistor T8 is turned-on to provide the output signal terminal OUT with the low-level signal of the second reference signal terminal VGL, so that a low-level signal is output at the output signal terminal OUT.

Thereafter IN=0, CK=1, and CKB=1.

When CK=1, the first switching transistor T1 remains turned-off so that the first node N1 is floating. The first node N1 remains at a low electric potential due to the bootstrap of the second capacitor C2, so that the fourth switching transistor T4 remains turned-on. When IN=0, the second switching transistor T2 remains turned-on to provide the second node N2 with the high-level signal of the first clock signal terminal CK so that the second node N2 is at a high electric potential. With the second node N2 at a high electric potential, the third switching transistor T3 is turned-off so that the third node N3 is floating. The third node N3 remains at a high electric potential due to the bootstrap of the third capacitor C3, so that the sixth switching transistor T6 and the seventh switching transistor T7 are turned-off. When CKB=1, the fifth switching transistor T5 is turned-off so that the fourth node N4 is floating; and the fourth node N4 remains at a low electric potential due to the bootstrap of the fourth capacitor C4, so that the eighth switching transistor T8 remains turned-on to provide the output signal terminal OUT with the low-level signal of the second reference signal terminal VGL. As a result, a low-level signal is output at the output signal terminal OUT.

In the third stage t3, i.e., an output held stage, initially IN=1, CK=0, and CKB=1.

When CK=0, the first switching transistor T1 is turned-on to provide the first node N1 with the high-level signal of the input signal terminal IN so that the first node N1 is at a high electric potential. With the first node N1 at a high electric potential, the fourth switching transistor T4 is turned-off so that the first electrode of the second capacitor C2 is floating; and the first electrode of the second capacitor C2 is turned to be at a high electric potential by the coupling effect of the second capacitor C2. When IN=1, the second switching transistor T2 is turned-off so that the second node N2 is floating, and when CKB=1 and the coupling effect of the first capacitor C1, the second node N2 is turned to be at a high electric potential. With the second node N2 at a high electric potential, the third switching transistor T3 is turned-off so that the third node N3 is floating; and the third node N3 remains at a high electric potential due to the bootstrap of the third capacitor C3, so that the sixth switching transistor T6 and the seventh switching transistor T7 are turned-off. When CKB=1, the fifth switching transistor T5 is turned-off so that the fourth node N4 is floating; and the fourth node N4 remains at a low electric potential due to the bootstrap of the fourth capacitor C4, so that the eighth switching transistor T8 remains turned-on to provide the output signal terminal OUT with the low-level signal of the second reference signal terminal VGL. As a result, a low-level signal is output at the output signal terminal OUT.

Thereafter IN=1, CK=1, and CKB=1.

When CK=1, the first switching transistor T1 is turned-off so that the first node N1 is floating. The first node N1 remains at a high electric potential due to the bootstrap of the second capacitor C2, so that the fourth switching transistor T4 remains turned-off. When IN=1, the second switching transistor T2 is turned-off so that the second node N2 is floating, and when CKB=1 and the bootstrap of the first capacitor C1, the second node N2 remains at a high electric potential. With the second node N2 at a high electric potential, the third switching transistor T3 is turned-off so that the third node N3 is floating; and the third node N3 remains at a high electric potential due to the bootstrap of the third capacitor C3, so that the sixth switching transistor T6 and the seventh switching transistor T7 are turned-off. When CKB=1, the fifth switching transistor T5 is turned-off so that the fourth node N4 is floating; and the fourth node N4 remains at a low electric potential due to the bootstrap of the fourth capacitor C4, so that the eighth switching transistor T8 remains turned-on to provide the output signal terminal OUT with the low-level signal of the second reference signal terminal VGL. As a result, a low-level signal is output at the output signal terminal OUT.

In the fourth stage t4, i.e., a reset stage, initially IN=1, CK=1, and CKB=0.

When CK=1, the first switching transistor T1 is turned-off so that the first node N1 is floating. The first node N1 remains at a high electric potential due to the bootstrap of the second capacitor C2, so that the fourth switching transistor T4 is turned-off. When IN=1, the second switching transistor T2 is turned-off so that the second node N2 is floating, and when CKB=0 and the coupling effect of the first capacitor C1, the second node N2 is turned to be at a low electric potential. With the second node N2 at a low electric potential, the third switching transistor T3 is turned-on to provide the third node N3 with the low-level signal of the second clock signal terminal CKB, so that the third node N3 is at a low electric potential. With the third node N3 at a low electric potential, the sixth switching transistor T6 is turned-on to provide the fourth node N4 with the high-level signal of the first reference signal terminal VGH; and when CKB=0, the fifth switching transistor T5 is turned-on so that the fourth node N4 is at a high electric potential, and thus the eighth switching transistor T8 is turned-off. With the third node N3 at a low electric potential, the seventh switching transistor T7 is turned-on to provide the output signal terminal OUT with the high-level signal of the first reference signal terminal VGH.

Thereafter IN=1, CK=1, and CKB=1.

When CK=1, the first switching transistor T1 is turned-off so that the first node N1 is floating. The first node N1 remains at a high electric potential due to the bootstrap of the second capacitor C2, so that the fourth switching transistor T4 is turned-off. When IN=1, the second switching transistor T2 is turned-off so that the second node N2 is floating, and when CKB=1 and the coupling effect of the first capacitor C1, the second node N2 is turned to be at a high electric potential. With the second node N2 at a high electric potential, the third switching transistor T3 is turned-off so that the third node N3 is floating; and the third node N3 remains at a low electric potential due to the bootstrap of the third capacitor C3, so that the sixth switching transistor T6 is turned-on to provide the fourth node N4 with the high-level signal of the first reference signal terminal VGH. When CKB=1, the fifth switching transistor T5 is turned-off so that the fourth node N4 is floating; and the fourth node N4 remains at a high electric potential due to the bootstrap of the fourth capacitor C4, so that the eighth switching transistor T8 remains turned-off. With the third node N3 at a low electric potential, the seventh switching transistor T7 is turned-on to provide the output signal terminal OUT with the high-level signal of the first reference signal terminal VGH.

In the fifth stage t5, i.e., a reset held stage, initially IN=1, CK=0, and CKB=1.

When CK=0, the first switching transistor T1 is turned-on to provide the first node N1 with the high-level signal of the input signal terminal IN so that the first node N1 is at a high electric potential. With the first node N1 at a high electric potential, the fourth switching transistor T4 is turned-off so that the first electrode of the second capacitor C2 is floating; and the first electrode of the second capacitor C2 remains at a high electric potential due to the bootstrap of the second capacitor C2. When IN=1, the second switching transistor T2 is turned-off so that the second node N2 is floating, and when CKB=1 and the bootstrap of the first capacitor C1, the second node N2 remains at a high electric potential. With the second node N2 at a high electric potential, the third switching transistor T3 is turned-off so that the third node N3 is floating; and the third node N3 remains at a low electric potential due to the bootstrap of the third capacitor C3, so that the sixth switching transistor T6 is turned-on to provide the fourth node N4 with the high-level signal of the first reference signal terminal VGH. When CKB=1, the fifth switching transistor T5 is turned-off so that the fourth node N4 is floating; and the fourth node N4 remains at a high electric potential due to the bootstrap of the fourth capacitor C4, so that the eighth switching transistor T8 remains turned-off. With the third node N3 at a low electric potential, the seventh switching transistor T7 is turned-on to provide the output signal terminal OUT with the high-level signal of the first reference signal terminal VGH.

Thereafter IN=1, CK=1, and CKB=1. An operating process in this stage is substantially the same as the operating process in the fourth stage t4 with IN=1, CK=1, and CKB=1, so a detailed description thereof will be omitted here.

In the first embodiment, the operating process in the fourth stage t4 and the fifth stage t5 is repeated after the fifth stage t5, until the signal at the input signal terminal is a low-level signal again. The shift register according to the embodiments above of the disclosure can output the low-level signal which is shifted, which may be applicable to a gate scan circuit; and there will be no step at a falling edge, thus enabling an output gate scan signal to be output in a stable manner.

Second Embodiment

Figure 9B:
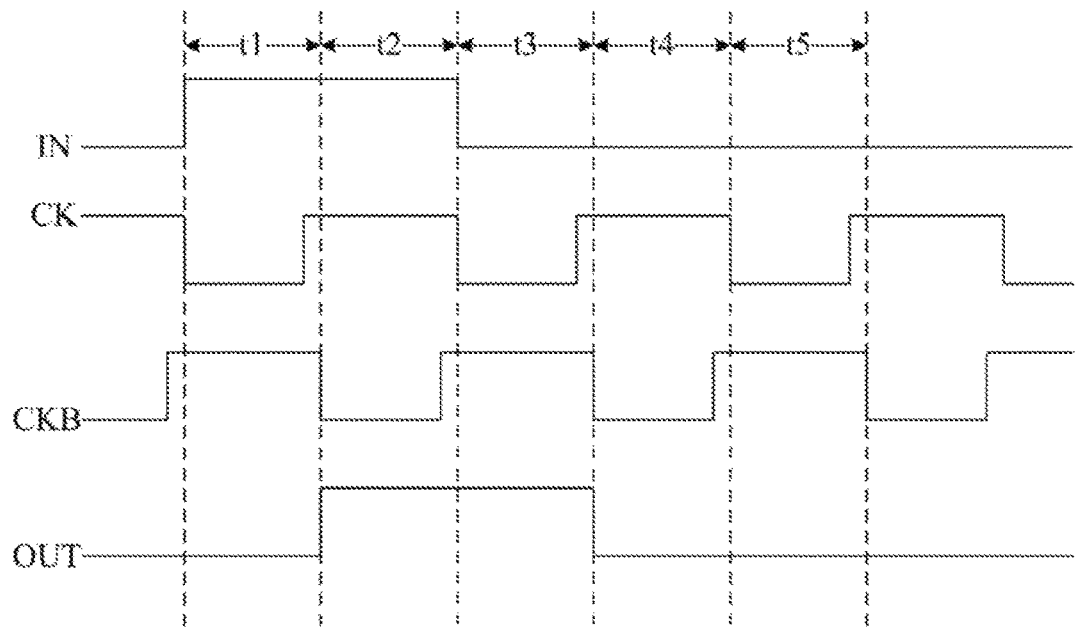
FIG. 9B is another input-output timing diagram corresponding to a shift register according to an embodiment of the disclosure.

Taking the structure of the shift register as illustrated in FIG. 4 as an example, the electric potential of the first reference signal terminal VGH is a high electric potential, and the electric potential of the second reference signal terminal VGL is a low electric potential. FIG. 9B illustrates a corresponding input-output timing diagram thereof, and particularly five stages including a first stage, a second stage, a third stage, a fourth stage, and a fifth stage in the input-output timing diagram as illustrated in FIG. 9B.

In the first stage t1, i.e., an initialization stage, initially IN=1, CK=0, and CKB=1.

An initialized electric potential of the first node N1 is a high electric potential, an initialized electric potential of the second node N2 is a low electric potential, an initialized electric potential of the third node N3 is a high electric potential, and an initialized electric potential of the fourth node N4 is a low electric potential.

When CK=0, the first switching transistor T1 is turned-on to provide the first node N1 with the high-level signal of the input signal terminal IN so that the first node N1 is at a high electric potential. With the first node N1 at a high electric potential, the fourth switching transistor T4 is turned-off so that the first electrode of the first capacitor C2 is floating; and the first electrode of the second capacitor C2 is turned to be at a high electric potential due to the coupling effect of the second capacitor C2. When IN=1, the second switching transistor T2 is turned-off so that the second node N2 is floating, and when CKB=1 and the coupling effect of the first capacitor C1, the second node N2 is turned to be at a high electric potential. With the second node N2 at a high electric potential, the third switching transistor T3 is turned-off so that the third node N3 is floating; and the third node N3 remains at a high electric potential due to the bootstrap of the third capacitor C3, so the sixth switching transistor T6 and the seventh switching transistor T7 are turned-off. When CKB=1, the fifth switching transistor T5 is turned-off so that the fourth node N4 is floating; and the fourth node N4 remains at a low electric potential due to the bootstrap of the fourth capacitor C4, so that the eighth switching transistor T8 is turned-on to provide the output signal terminal OUT with the low-level signal of the second reference signal terminal VGL. As a result, a low-level signal is output at the output signal terminal OUT.

Thereafter IN=1, CK=1, and CKB=1.

When CK=1, the first switching transistor T1 is turned-off so that the first node N1 is floating. The first node N1 remains at a high electric potential due to the bootstrap of the second capacitor C2, so that the fourth switching transistor T4 remains turned-off. When IN=1, the second switching transistor T2 is turned-off so that the second node N2 is floating, and when CKB=1 and the bootstrap of the first capacitor C1, the second node N2 remains at a high electric potential. With the second node N2 at a high electric potential, the third switching transistor T3 is turned-off so that the third node N3 is floating. The third node N3 remains at a high electric potential due to the bootstrap of the third capacitor C3, so that the sixth switching transistor T6 and the seventh switching transistor T7 are turned-off. When CKB=1, the fifth switching transistor T5 is turned-off so that the fourth node N4 is floating; and the fourth node N4 remains at a low electric potential due to the bootstrap of the fourth capacitor C4, so that the eighth switching transistor T8 is turned-on to provide the output signal terminal OUT with the low-level signal of the second reference signal terminal VGL. As a result, a low-level signal is output at the output signal terminal OUT.

In the second stage t2, i.e., a shift stage, initially IN=1, CK=1, and CKB=0.

When CK=1, the first switching transistor T1 is turned-off so that the first node N1 is floating. The first node N1 remains at a high electric potential due to the bootstrap of the second capacitor C2, so that the fourth switching transistor T4 is turned-off. When IN=1, the second switching transistor T2 is turned-off so that the second node N2 is floating, and when CKB=0 and the coupling effect of the first capacitor C1, the second node N2 is turned to be at a low electric potential. With the second node N2 at a low electric potential, the third switching transistor T3 is turned-on to provide the third node N3 with the low-level signal of the second clock signal terminal CKB, so that the third node N3 is at a low electric potential. With the third node N3 at a low electric potential, the sixth switching transistor T6 is turned-on to provide the fourth node N4 with the high-level signal of the first reference signal terminal VGH, and when CKB=0, the fifth switching transistor T5 is turned-on so that the fourth node N4 is at a high electric potential, and thus the eighth switching transistor T8 is turned-off. With the third node N3 at a low electric potential, the seventh switching transistor T7 is turned-on to provide the output signal terminal OUT with the high-level signal of the first reference signal terminal VGH.

Thereafter IN=1, CK=1, and CKB=1.

When CK=1, the first switching transistor T1 is turned-off so that the first node N1 is floating. The first node N1 remains at a high electric potential due to the bootstrap of the second capacitor C2, so that the fourth switching transistor T4 is turned-off. When IN=1, the second switching transistor T2 is turned-off so that the second node N2 is floating, and when CKB=1 and the coupling effect of the first capacitor C1, the second node N2 is turned to be at a high electric potential. With the second node N2 at a high electric potential, the third switching transistor T3 is turned-off so that the third node N3 is floating. The third node N3 remains at a low electric potential due to the bootstrap of the third capacitor C3, so that the sixth switching transistor T6 is turned-on to provide the fourth node N4 with the high-level signal of the first reference signal terminal VGH. When CKB=1, the fifth switching transistor T5 is turned-off so that the fourth node N4 is floating; and the fourth node N4 remains at a high electric potential due to the bootstrap of the fourth capacitor C4, so that the eighth switching transistor T8 remains turned-off. With the third node N3 at a low electric potential, the seventh switching transistor T7 is turned-on to provide the output signal terminal with the high-level signal of the first reference signal terminal VGH.

In the third stage t3, i.e., an output held stage, initially IN=0, CK=0, and CKB=1.

When CK=0, the first switching transistor T1 is turned-on to provide the first node N1 with the low-level signal of the input signal terminal IN so that the first node N1 is at a low electric potential. With the first node N1 at a low electric potential, the fourth switching transistor T4 is turned-on to provide the drain of the fourth switching transistor T4, the first electrode of the second capacitor C2, and the source of the fifth switching transistor T5 with the high-level signal of the second clock signal terminal CKB to charge the second capacitor C2. When IN=0, the second switching transistor T2 is turned-on to provide the second node N2 with the low-level signal of the first clock signal terminal CK so that the second node N2 is at a low electric potential. With the second node N2 at a low electric potential, the third switching transistor T3 is turned-on to provide the third node N3 with the high-level signal of the second clock signal terminal CKB, so that the third node N3 is at a high electric potential. With the third node N3 at a high electric potential, the sixth switching transistor T6 and the seventh switching transistor T7 are turned-off. When CKB=1, the fifth switching transistor T5 is turned-off so that the fourth node N4 is floating; and the fourth node N4 remains at a high electric potential due to the bootstrap of the fourth capacitor C4, so that the eighth switching transistor T8 turns off. As a result, a high-level signal is output at the output signal terminal OUT.

Thereafter IN=0, CK=1, and CKB=1.

When CK=1, the first switching transistor T1 is turned-off so that the first node N1 is floating. The first node N1 remains at a low electric potential due to the bootstrap of the second capacitor C2, so that the fourth switching transistor T4 remains turned-on. When IN=0, the second switching transistor T2 is turned-on to provide the second node N2 with the high-level signal of the first clock signal terminal CK, so that the second node N2 is at a high electric potential. With the second node N2 at a high electric potential, the third switching transistor T3 is turned-off so that the third node N3 is floating; and the third node N3 remains at a high electric potential due to the bootstrap of the third capacitor C3, so that the sixth switching transistor T6 and the seventh switching transistor T7 are turned-off. When CKB=1, the fifth switching transistor T5 remains turned-off so that the fourth node N4 is floating; and the fourth node N4 remains at a high electric potential due to the bootstrap of the fourth capacitor C4, so that the eighth switching transistor T8 is turned-off. As a result, a high-level signal is kept being output at the output signal terminal OUT.

In the fourth stage t4, i.e., a reset stage, initially IN=0, CK=1, and CKB=0.

When CK=1, the first switching transistor T1 is turned-off so that the first node N1 is floating. The first node N1 remains at a low electric potential due to the bootstrap of the second capacitor C2, so that the fourth switching transistor T4 remains turned-on to provide the drain of the fourth switching transistor T4, the first electrode of the second capacitor C2, and the source of the fifth switching transistor T5 with the low-level signal of the second clock signal terminal CKB to discharge the second capacitor C2. When IN=0, the second switching transistor T2 is turned-on to provide the second node N2 with the high-level signal of the first clock signal terminal CK, so that the second node N2 is at a high electric potential. With the second node N2 at a high electric potential, the third switching transistor T3 is turned-off so that the third node N3 is floating; and the third node N3 remains at a high electric potential due to the bootstrap of the third capacitor C3, so the sixth switching transistor T6 and the seventh switching transistor T7 are turned-off. When CKB=0, the fifth switching transistor T5 is turned-on to provide the fourth node N4 with the high-level signal of the second clock signal terminal CKB through the fourth switching transistor T4, so that the fourth node N4 is at a low electric potential. With the fourth node N4 at a low electric potential, the eighth switching transistor T8 is turned-on to provide the output signal terminal OUT with the low-level signal of the second reference signal terminal VGL. As a result, a low-level signal is output at the output signal terminal OUT.

Thereafter IN=0, CK=1, and CKB=1.

When CK=1, the first switching transistor T1 remains turned-off so that the first node N1 is floating. The first node N1 remains at a low electric potential due to the bootstrap of the second capacitor C2, so that the fourth switching transistor T4 remains turned-on. When IN=0, the second switching transistor T2 remains turned-on to provide the second node N2 with the high-level signal of the first clock signal terminal CK. With the second node N2 at a high electric potential, the third switching transistor T3 is turned-off so that the third node N3 is floating; and the third node N3 remains at a high electric potential due to the bootstrap of the third capacitor C3, so that the sixth switching transistor T6 and the seventh switching transistor T7 are turned-off. When CKB=1, the fifth switching transistor T5 is turned-off so that the fourth node N4 is floating; and the fourth node N4 remains at a low electric potential due to the bootstrap of the fourth capacitor C4, so that the eighth switching transistor T8 remains turned-on to provide the output signal terminal OUT with the low-level signal of the second reference signal terminal VGL. As a result, a low-level signal is output at the output signal terminal OUT.

In the fifth stage t5, i.e., a reset held stage, initially IN=0, CK=0, and CKB=1.

When CK=0, the first switching transistor T1 is turned-on to provide the first node N1 with the low-level signal of the input signal terminal IN so that the first node N1 is at a low electric potential. With the first node N1 at a low electric potential, the fourth switching transistor T4 is turned-on to provide the drain of the fourth switching transistor T4, the first electrode of the second capacitor C2, and the source of the fifth switching transistor T5 with the high-level signal of the second clock signal terminal CKB to charge the second capacitor C2. When IN=0, the second switching transistor T2 is turned-on to provide the second node N2 with the low-level signal of the first clock signal terminal CK, so that the second node N2 is at a low electric potential. With the second node N2 at a low electric potential, the third switching transistor T3 is turned-on to provide the third node N3 with the high-level signal of the second clock signal terminal CKB, so that the third node N3 is at a high electric potential. With the third node N3 at a high electric potential, the sixth switching transistor T6 and the seventh switching transistor T7 are turned-off. When CKB=1, the fifth switching transistor T5 is turned-off so that the fourth node N4 is floating; and the fourth node N4 remains at a low electric potential due to the bootstrap of the fourth capacitor C4, so that the eighth switching transistor T8 is turned-on to provide the output signal terminal OUT with the low-level signal of the second reference signal terminal VGL. As a result, a low-level signal is output at the output signal terminal OUT.

Thereafter IN=0, CK=1, and CKB=1. An operating process in this stage is substantially the same as the operating process in the fourth stage t4 when IN=0, CK=1, and CKB=1, so a detailed description thereof will be omitted here.

In the second embodiment, the operating process in the fourth stage t4 and the fifth stage t5 is repeated after the fifth stage t5, until the signal at the input signal terminal is a high-level signal again. The shift register according to the embodiments above of the disclosure can output the high-level signal which is shifted, which may be applicable to a light-emission scan circuit; and there will be no step at a falling edge, thus enabling a light-emission control signal to be output in a stable manner.

Third Embodiment

Taking the structure of the shift register as illustrated in FIG. 5 as an example, the electric potential of the first reference signal terminal VGH is a high electric potential, and the electric potential of the second reference signal terminal VGL is a low electric potential. FIG. 9A illustrates a corresponding input-output timing diagram thereof, and particularly five stages including a first stage, a second stage, a third stage, a fourth stage, and a fifth stage in the input-output timing diagram as illustrated in FIG. 9A.

An operating process in respective stages according to the third embodiment is substantially the same as the operating process in the respective stages according to the first embodiment, so a repeated description thereof will be omitted here. Only the additional ninth switching transistor T9 operating in the respective stages will be described.

In the first stage t1, i.e., an initialization stage, initially IN=0, CK=0, and CKB=1. With the fourth node N4 is at a high electric potential, the ninth switching transistor T9 is turned-off. Thereafter IN=0, CK=1, and CKB=1. With the fourth node N4 at a high electric potential, the ninth switching transistor T9 is turned-off.

In the second stage t2, i.e., a shift stage, initially IN=0, CK=1, and CKB=0. With the fourth node N4 at a low electric potential, the ninth switching transistor T9 is turned-on to provide the third node N3 with the high-level signal of the first reference signal terminal VGH, thus shortening a period of time in which the third node N3 is floating, and making the scheme output in a more stable manner. Thereafter IN=0, CK=1, and CKB=1. With the fourth node N4 at a low electric potential, the ninth switching transistor T9 is turned-on to provide the third node N3 with the high-level signal of the first reference signal terminal VGH, thus shortening a period of time in which the third node N3 is floating, and making the scheme output more stable.

In the third stage t3, i.e., an output held stage, initially IN=1, CK=0, and CKB=1. With the fourth node N4 at a low electric potential, the ninth switching transistor T9 is turned-on to provide the third node N3 with the high-level signal of the first reference signal terminal VGH, thus shortening a period of time in which the third node N3 is floating, and making the scheme output more stable. Thereafter IN=1, CK=1, and CKB=1. With the fourth node N4 at a low electric potential, the ninth switching transistor T9 is turned-on to provide the third node N3 with the high-level signal of the first reference signal terminal VGH, thus shortening a period of time in which the third node N3 is floating, and making the scheme output more stable.

In the fourth stage t4, i.e., a reset stage, initially IN=1, CK=1, and CKB=0. With the fourth node N4 is at a high electric potential, the ninth switching transistor T9 is turned-off. Thereafter IN=1, CK=1, and CKB=1. With the fourth node N4 at a high electric potential, the ninth switching transistor T9 is turned-off.

In the fifth stage t5, i.e., a reset held stage, initially IN=1, CK=0, and CKB=1. With the fourth node N4 is at a high electric potential, the ninth switching transistor T9 is turned-off. Thereafter IN=1, CK=1, and CKB=1. With the fourth node N4 at a high electric potential, the ninth switching transistor T9 is turned-off.

Fourth Embodiment

Taking the structure of the shift register as illustrated in FIG. 6 as an example, the electric potential of the first reference signal terminal VGH is a high electric potential, and the electric potential of the second reference signal terminal VGL is a low electric potential. FIG. 9A illustrates a corresponding input-output timing diagram thereof, and particularly five stages including a first stage, a second stage, a third stage, a fourth stage, and a fifth stage in the input-output timing diagram as illustrated in FIG. 9A.

An operating process in respective stages according to the fourth embodiment is substantially the same as the operating process in the respective stages according to the third embodiment, so a repeated description thereof will be omitted here. Only the additional tenth switching transistor T10 operating in the respective stages will be described.

Since the electric potential of the second reference signal terminal VGL in the respective stages is a low electric potential, the tenth switching transistor T10 is turned-on, and can operate as a resistor to filter leakage circuit flowing into the fourth node N4. The voltage at the source of the tenth switching transistor T10 can be higher than the voltage at the drain thereof to thereby lower the voltage across the source and the drain of the sixth switching transistor T6 so as to prevent the sixth switching transistor T6 from failing, and to improve the stability of the scheme.

Fifth Embodiment

Figure 9C:
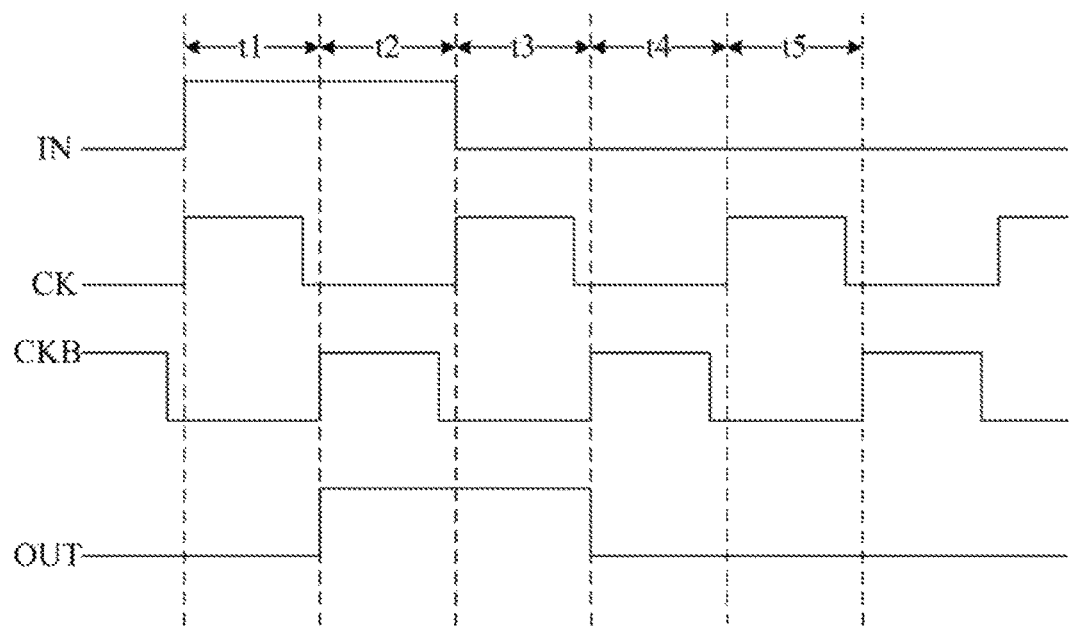
FIG. 9C is another input-output timing diagram corresponding to a shift register according to an embodiment of the disclosure.

Taking the structure of the shift register as illustrated in FIG. 8 as an example, the electric potential of the first reference signal terminal VGH is a low electric potential, and the electric potential of the second reference signal terminal VGL is a high electric potential. FIG. 9C illustrates a corresponding input-output timing diagram thereof, and particularly five stages including a first stage, a second stage, a third stage, a fourth stage, and a fifth stage in the input-output timing diagram as illustrated in FIG. 9C.

In the first stage t1, i.e., an initialization stage, initially IN=0, CK=1, and CKB=0.

An initialized electric potential of the first node N1 is a low electric potential, an initialized electric potential of the second node N2 is a high electric potential, an initialized electric potential of the third node N3 is a low electric potential, and an initialized electric potential of the fourth node N4 is a low electric potential.

When CK=1, the first switching transistor T1 is turned-on to provide the first node N1 with the high-level signal of the input signal terminal IN so that the first node N1 is at a high electric potential. With the first node N1 at a high electric potential, the fourth switching transistor T4 is turned-on to provide the drain of the fourth switching transistor T4, the first electrode of the second capacitor C2, and the source of the fifth switching transistor T5 with the low-level signal of the second clock signal terminal CKB to charge the second capacitor C2. When IN=1, the second switching transistor T2 is turned-on to provide the second node N2 with the high-level signal of the first clock signal terminal CK so that the second node N2 is at a high electric potential. When CKB=1, the eleventh switching transistor T11 is turned-on to provide the second node N2 with the high-level signal of the second reference signal terminal VGL, so that the second node N2 is at a high electric potential. With the second node N2 at a high electric potential, the third switching transistor T3 is turned-on to provide the third node N3 with the low-level signal of the second clock signal terminal CKB, so that the third node N3 is at a low electric potential. With the third node N3 at a low electric potential, the sixth switching transistor T6 and the seventh switching transistor T7 are turned-off. When CKB=0, the fifth switching transistor T5 is turned-off so that the fourth node N4 is floating; and the fourth node N4 remains at a low electric potential due to the bootstrap of the fourth capacitor C4, so that the eighth switching transistor T8 is turned-off. As a result, a low-level signal is kept being output at the output signal terminal OUT.

Thereafter IN=1, CK=0, and CKB=0.

When CK=0, the first switching transistor T1 and the eleventh switching transistor T11 are turned-off so that the first node N1 is floating. The first node N1 remains at a high electric potential due to the bootstrap of the second capacitor C2, so that the fourth switching transistor T4 remains turned-on. When IN=1, the second switching transistor T2 is turned-on to provide the second node N2 with the low-level signal of the first clock signal terminal CK so that the second node N2 is at a low electric potential. With the second node N2 at a low electric potential, the third switching transistor T3 is turned-off so that the third node N3 is floating. The third node N3 remains at a low electric potential due to the bootstrap of the third capacitor C3, so that the sixth switching transistor T6 and the seventh switching transistor T7 are turned-off. When CKB=0, the fifth switching transistor T5 remains turned-off so that the fourth node N4 is floating; and the fourth node N4 remains at a low electric potential due to the bootstrap of the fourth capacitor C4, so that the eighth switching transistor T8 is turned-off. As a result, a low-level signal is kept being output at the output signal terminal OUT.

In the second stage t2, i.e., a shift stage, initially IN=1, CK=0, and CKB=1.

When CK=0, the first switching transistor T1 and the eleventh switching transistor T11 are turned-off so that the first node N1 is floating. The first node N1 remains at a high electric potential due to the bootstrap of the second capacitor C2, so that the fourth switching transistor T4 remains turned-on to provide the drain of the fourth switching transistor T4, the first electrode of the second capacitor C2, and the source of the fifth switching transistor T5 with the high-level signal of the second clock signal terminal CKB to discharge the second capacitor C2. When IN=1, the second switching transistor T2 is turned-on to provide the second node N2 with the low-level signal of the first clock signal terminal CK so that the second node N2 is at a low electric potential. With the second node N2 at a low electric potential, the third switching transistor T3 is turned-off so that the third node N3 is floating. The third node N3 remains at a low electric potential due to the bootstrap of the third capacitor C3, so that the sixth switching transistor T6 and the seventh switching transistor T7 are turned-off. When CKB=1, the fifth switching transistor T5 is turned-on to provide the fourth node N4 with the high-level signal of the second clock signal terminal CKB through the fourth switching transistor T4 so that the fourth node N4 is at a high electric potential. With the fourth node N4 at a high electric potential, the eighth switching transistor T8 is turned-on to provide the output signal terminal OUT with the high-level signal of the second reference signal terminal VGL, so that a high-level signal is output at the output signal terminal OUT.

Thereafter IN=1, CK=0, and CKB=0.

When CK=0, the first switching transistor T1 and the eleventh switching transistor T11 remain turned-off so that the first node N1 is floating. The first node N1 remains at a high electric potential due to the bootstrap of the second capacitor C2, so that the fourth switching transistor T4 remains turned-on. When IN=1, the second switching transistor T2 remains turned-on to provide the second node N2 with the low-level signal of the first clock signal terminal CK so that the second node N2 is at a low electric potential. With the second node N2 at a low electric potential, the third switching transistor T3 is turned-off so that the third node N3 is floating. The third node N3 remains at a low electric potential due to the bootstrap of the third capacitor C3, so that the sixth switching transistor T6 and the seventh switching transistor T7 are turned-off. When CKB=0, the fifth switching transistor T5 is turned-off so that the fourth node N4 is floating; and the fourth node N4 remains at a high electric potential due to the bootstrap of the fourth capacitor C4, so that the eighth switching transistor T8 remains turned-on to provide the output signal terminal OUT with the high-level signal of the second reference signal terminal VGL. As a result, a high-level signal is output at the output signal terminal OUT.

In the third stage t3, i.e., an output held stage, initially IN=0, CK=1, and CKB=0.

When CK=1, the first switching transistor T1 is turned-on to provide the first node N1 with the low-level signal of the input signal terminal IN so that the first node N1 is at a low electric potential. With the first node N1 at a low electric potential, the fourth switching transistor T4 is turned-off so that the first electrode of the second capacitor C2 is floating; and the first electrode of the second capacitor C2 is turned to be at a low electric potential by the coupling effect of the second capacitor C2. When IN=0, the second switching transistor T2 is turned-off, and when CK=1, the eleventh switching transistor T11 is turned-on to provide the second node N2 with the high-level signal of the second reference signal terminal VGL, so that the second node N2 is at a high electric potential. With the second node N2 at a high electric potential, the third switching transistor T3 is turned-on to transmit the low-level signal of the second clock signal terminal CKB to the third node N3, so that the third node n3 is at a low electric potential, and thus the sixth switching transistor T6 and the seventh switching transistor T7 are turned-off. When CKB=0, the fifth switching transistor T5 is turned-off so that the fourth node N4 is floating; and the fourth node N4 remains at a high electric potential due to the bootstrap of the fourth capacitor C4, so that the eighth switching transistor T8 remains turned-on to provide the output signal terminal OUT with the high-level signal of the second reference signal terminal VGL. As a result, a high-level signal is output at the output signal terminal OUT.

Thereafter IN=0, CK=0, and CKB=0.

When CK=0, the first switching transistor T1 and the eleventh switching transistor T11 are turned-off so that the first node N1 is floating. The first node N1 remains at a low electric potential due to the bootstrap of the second capacitor C2, so that the fourth switching transistor T4 remains turned-off. When IN=0, the second switching transistor T2 is turned-off so that the second node N2 is floating; and the second node N2 remains at a high electric potential due to the bootstrap of the first capacitor C1. With the second node N2 at a high electric potential, the third switching transistor T3 is turned-on to transmit the low-level signal of the second clock signal terminal CKB to the third node N3, so that the third node N3 is at a low electric potential, and thus the sixth switching transistor T6 and the seventh switching transistor T7 are turned-off. With CKB=0, the fifth switching transistor T5 is turned-off so that the fourth node N4 is floating; and the fourth node N4 remains at a high electric potential due to the bootstrap of the fourth capacitor C4, so that the eighth switching transistor T8 remains turned-on to provide the output signal terminal OUT with the high-level signal of the second reference signal terminal VGL. As a result, a high-level signal is output at the output signal terminal OUT.

In the fourth stage t4, i.e., a reset stage, initially IN=0, CK=0, and CKB=1.

When CK=0, the first switching transistor T1 and the eleventh switching transistor T11 are turned-off so that the first node N1 is floating. The first node N1 remains at a low electric potential due to the bootstrap of the second capacitor C2, so that the fourth switching transistor T4 is turned-off. When IN=0, the second switching transistor T2 is turned-off so that the second node N2 is floating; and the second node N2 remains at a high electric potential due to the bootstrap of the first capacitor C1. With the second node N2 at a high electric potential, the third switching transistor T3 is turned-on to provide the third node N3 with the high-level signal of the second clock signal terminal CKB, so that the third node N3 is at a high electric potential. With the third node N3 at a high electric potential, the sixth switching transistor T6 is turned-on to provide the fourth node N4 with the low-level signal of the first reference signal terminal VGH; and when CKB=1, the fifth switching transistor T5 is turned-on so that the fourth node N4 is at a low electric potential, and thus the eighth switching transistor T8 is turned-off. With the third node N3 at a high electric potential, the seventh switching transistor T7 is turned-on to provide the output signal terminal OUT with the low-level signal of the first reference signal terminal VGH.

Thereafter IN=0, CK=0, and CKB=0.

When CK=0, the first switching transistor T1 and the eleventh switching transistor T110 are turned-off so that the first node N1 is floating. The first node N1 remains at a low electric potential due to the bootstrap of the second capacitor C2, so that the fourth switching transistor T4 is turned-off. When IN=0, the second switching transistor T2 is turned-off so that the second node N2 is floating; and the second node N2 is turned to be at a low electric potential due to the coupling effect of the first capacitor C1. With the second node N2 at a low electric potential, the third switching transistor T3 is turned-off so that the third node N3 is floating; and the third node N3 remains at a high electric potential due to the bootstrap of the third capacitor C3, so that the sixth switching transistor T6 is turned-on to provide the fourth node N4 with the low-level signal of the first reference signal terminal VGH. When CKB=0, the fifth switching transistor T5 is turned-off so that the fourth node N4 is floating; and the fourth node N4 remains at a low electric potential due to the bootstrap of the fourth capacitor C4, so that the eighth switching transistor T8 remains turned-off. With the third node N3 at a high electric potential, the seventh switching transistor T7 is turned-on to provide the output signal terminal OUT with the low-level signal of the first reference signal terminal VGH.

In the fifth stage t5, i.e., a reset held stage, initially IN=0, CK=1, and CKB=0.

When CK=1, the first switching transistor T1 is turned-on to provide the first node N1 with the low-level signal of the input signal terminal IN so that the first node N1 is at a low electric potential. With the first node N1 at a low electric potential, the fourth switching transistor T4 is turned-off so that the first electrode of the second capacitor C2 is floating; and the first electrode of the second capacitor C2 remains at a low electric potential due to the bootstrap of the second capacitor C2. When IN=0, the second switching transistor T2 is turned-off, and when CK=1, the eleventh switching transistor T11 is turned-on to provide the second node N2 with the high-level signal of the second reference signal terminal VGL, so that the second node N2 is at a high electric potential. With the second node N2 at a high electric potential, the third switching transistor T3 is turned-on to provide the third node N3 with the low-level signal of the second clock signal terminal CKB, so the sixth switching transistor T6 and the seventh switching transistor T7 are turned-off. When CKB=0, the fifth switching transistor T5 is turned-off so that the fourth node N4 is floating; and the fourth node N4 remains at a low electric potential due to the bootstrap of the fourth capacitor C4, so that the eighth switching transistor T8 remains turned-off. As a result, a low-level signal is kept being output at the output signal terminal OUT.

Thereafter IN=0, CK=0, and CKB=0. An operating process in this stage is substantially the same as the operating process in the fourth stage t4 when IN=0, CK=0, and CKB=0, so a detailed description thereof will be omitted here.

In the fifth embodiment, the operating process in the fourth stage t4 and the fifth stage t5 is repeated after the fifth stage t5, until the signal at the input signal terminal is a high-level signal again. The shift register according to the embodiments above of the disclosure can output the high-level signal which is shifted, which may be applicable to a light-emission control circuit; and there will be no step at a falling edge, thus enabling a light-emission control signal to be output in a stable manner.

Based upon the same inventive idea, when a gate scan signal of a scan control transistor is provided using the gate driver circuit according to the embodiments of the disclosure, an embodiment of the disclosure further provides a method for driving the gate driver circuit as illustrated in FIG. 9A and FIG. 9C, where the method includes the following operations.

A first stage t1, providing the input signal terminal IN and the first clock signal terminal CK with a first level signal, and the second clock signal terminal CKB with a second level signal, and outputting the second level signal at the output signal terminal OUT.

A second stage t2, providing the input signal terminal IN and the second clock signal terminal CKB with the first level signal, and the first clock signal terminal CK with the second level signal, and outputting the first level signal at the output signal terminal OUT.

A third stage t3, providing the input signal terminal IN and the second clock signal terminal CKB with the second level signal, and the first clock signal terminal CK with the first level signal, and outputting the first level signal at the output signal terminal OUT.

A fourth stage t4, providing the input signal terminal IN and the first clock signal terminal CK with the second level signal, and the second clock signal terminal CKB with the first level signal, and outputting the second level signal at the output signal terminal OUT.

A fifth stage t5, providing the input signal terminal IN and the second clock signal terminal CKB with the second level signal, and the first clock signal terminal CK with the first level signal, and outputting the second level signal at the output signal terminal OUT.

Figure 11A:
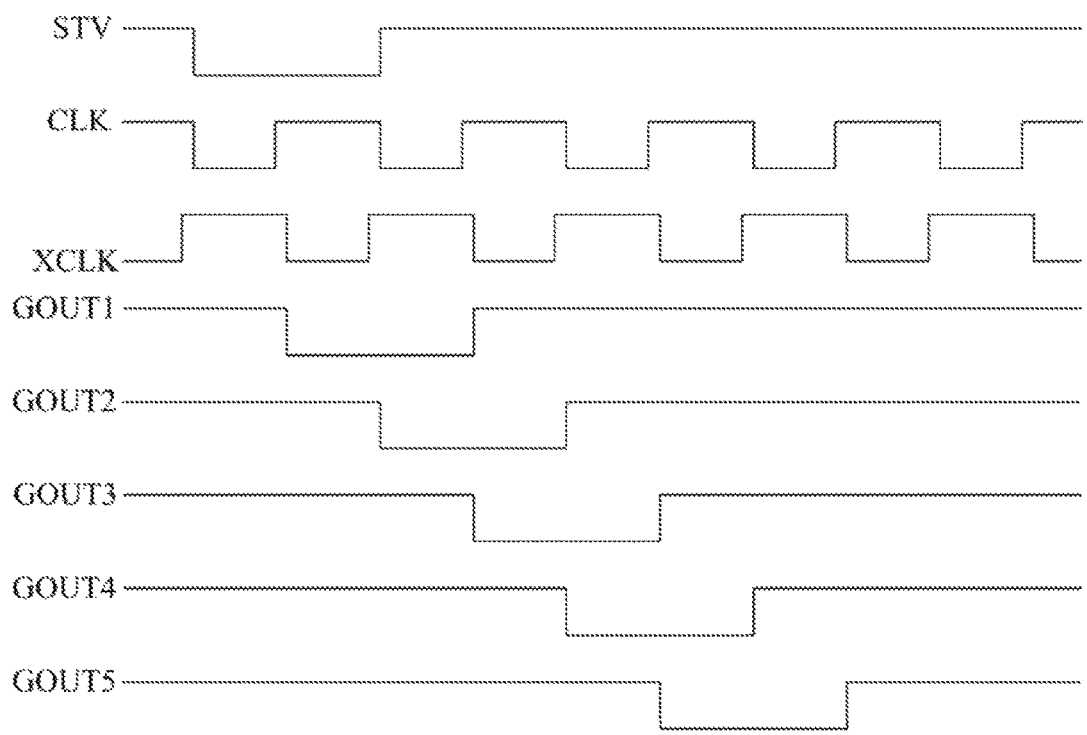
FIG. 11A is an input-output timing diagram corresponding to a gate driver circuit according to an embodiment of the disclosure.

In a particular implementation, the first level signal in the method above for driving the gate driver circuit may be a high-level signal, and correspondingly the second level signal may be a low-level signal; or the first level signal may be a low-level signal, and correspondingly the second level signal may be a high-level signal, particularly dependent upon whether a transistor receiving a gate scan signal is an N-type transistor or a P-type transistor. Particularly FIG. 9C illustrates a scheme timing diagram of a shift register, where the first level signal is a high-level signal, and the second level signal is a low-level signal. Particularly FIG. 9A illustrates a scheme timing diagram of a shift register, where the first level signal is a high-level signal, and the second level signal is a low-level signal; and correspondingly FIG. 11A illustrates a signal timing diagram of a gate driver circuit consisted of cascade shift registers, where output signals may overlap no matter whether an input signal is a high-level trigger signal or a low-level trigger signal.

Based upon the same inventive idea, when a light-emission control signal of a light-emission control transistor is provided using the gate driver circuit according to the embodiments of the disclosure, an embodiment of the disclosure further provides a method for driving the gate driver circuit as illustrated in FIG. 9B, where the method includes the following operations.

A first stage t1, providing the first clock signal terminal CK with a first level signal, and the input signal terminal IN and the second clock signal terminal CKB with a second level signal, and outputting the first level signal at the output signal terminal OUT.

A second stage t2, providing the second clock signal terminal CKB with the first level signal, and the input signal terminal IN and the first clock signal terminal CK with the second level signal, and outputting the second level signal at the output signal terminal OUT.

A third stage t3, providing the second clock signal terminal CKB with the second level signal, and the input signal terminal IN and the first clock signal terminal CK with the first level signal, and outputting the second level signal at the output signal terminal OUT.

A fourth stage t4, providing the first clock signal terminal CK with the second level signal, and the input signal terminal IN and the second clock signal terminal CKB with the first level signal, and outputting the first level signal at the output signal terminal OUT.

A fifth stage t5, providing the second clock signal terminal CKB with the second level signal, and the input signal terminal IN and the first clock signal terminal CK with the first level signal, and outputting the first level signal at the output signal terminal OUT.

Figure 11B:
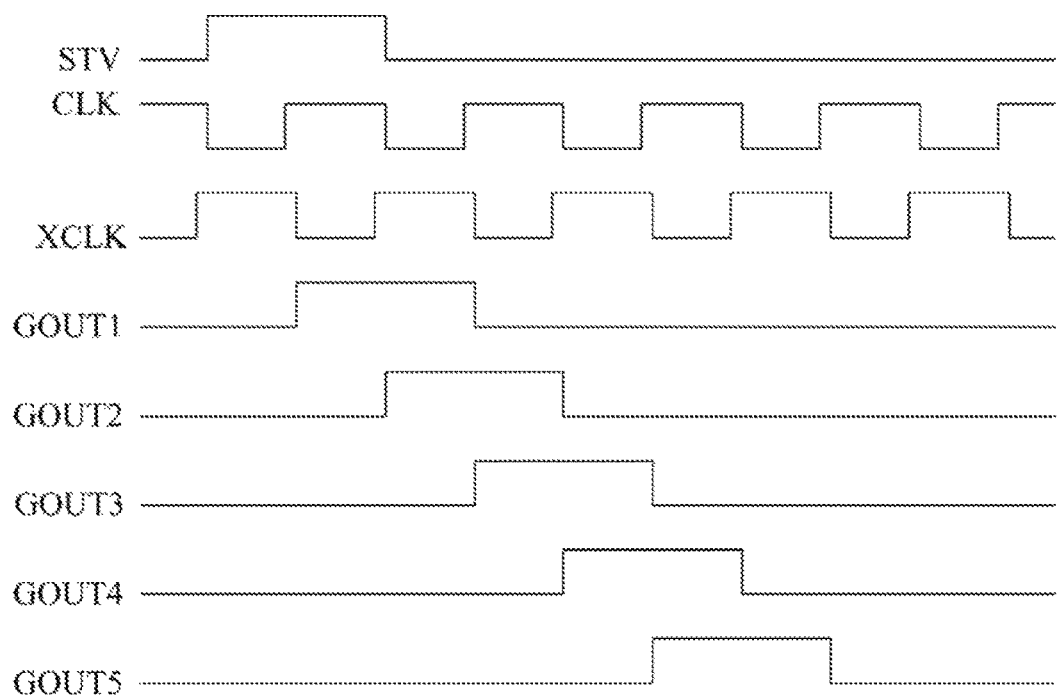
FIG. 11B is another input-output timing diagram corresponding to a gate driver circuit according to an embodiment of the disclosure.

In a particular implementation, the first level signal in the method above for driving the gate driver circuit may be a high-level signal, and correspondingly the second level signal may be a low-level signal; or the first level signal may be a low-level signal, and correspondingly the second level signal may be a high-level signal, particularly dependent upon whether a transistor receiving a light-emission control signal is an N-type transistor or a P-type transistor. Particularly FIG. 9B illustrates a scheme timing diagram of a shift register, where the first level signal is a low-level signal, and the second level signal is a high-level signal; and correspondingly FIG. 11B illustrates a signal timing diagram of a gate driver circuit consisted of cascade shift registers, where output signals may overlap no matter whether an input signal is a high-level trigger signal or a low-level trigger signal.

Figure 10:
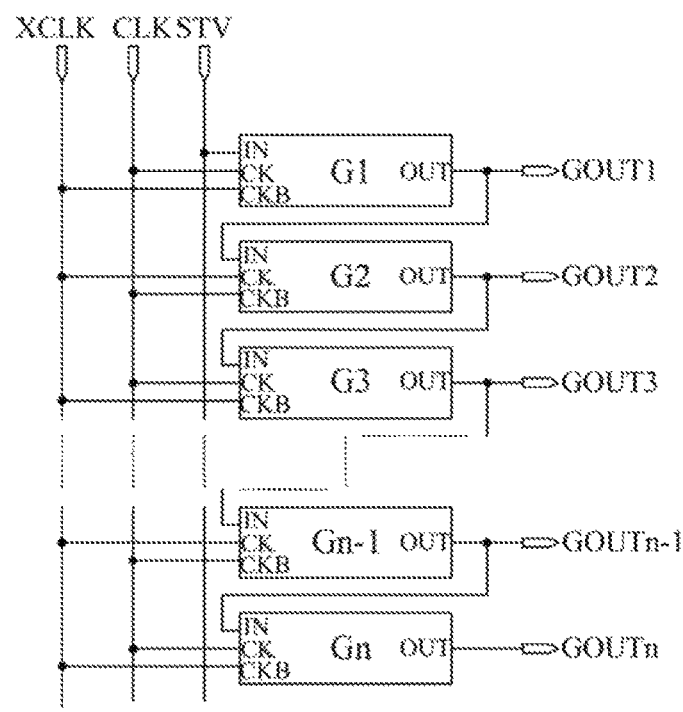
FIG. 10 is a schematic structural diagram of a gate driver circuit according to an embodiment of the disclosure.

An embodiment of the disclosure further provides a gate driver circuit as illustrated in FIG. 10, which particularly includes a plurality of cascade shift registers G1, G2, G3, . . . , Gn−1, Gn (N shift registers in total, where 1≤n≤N) according to the embodiments of the disclosure.

Where the input signal terminal IN of each level of shift register Gn other than the first level of shift register G1 is electrically connected with the output signal terminal OUT of the preceding level of shift register Gn−1; and the input signal terminal IN of the first level of shift register G1 is electrically connected with a frame start signal terminal STV.

A particular structure of each shift register in the gate driver circuit above is functionally and structurally the same as the shift register according to the embodiments of the disclosure above, so a repeated description thereof will be omitted here. Respective signals output at the respective output signal terminals in the gate driver circuit above are as illustrated in FIG. 11A and FIG. 11B.

Particularly in the gate driver circuit according to the embodiments of the disclosure, the first reference signal terminals VGH of the respective levels of shift registers Gn are connected with the same direct-current signal terminal, and the second reference signal terminals VGL of the respective levels of shift registers Gn are connected with the same direct-current signal terminal.

Particularly in the gate driver circuit according to the embodiments of the disclosure, as illustrated in FIG. 10, both the first clock signal terminal CK of the (2k−1)-th level of shift register, and the second clock signal terminal CKB of the 2k-th level of shift register are connected with the same clock terminal, i.e., the first clock terminal CLK. Both the second clock signal terminal CKV of the (2k−1)-th level of shift register and the first clock signal terminal CK of the 2k-th level of shift register are connected with the same clock terminal, i.e., the second clock terminal XCLK, where k is a positive integer.

The gate driver circuit according to the embodiments of the disclosure above can be applied to provision of a light-emission control signal of a light-emission control transistor, or to provision of a gate scan signal of a scan control transistor, although the embodiments of the disclosure will not be limited thereto.

Figure 12:
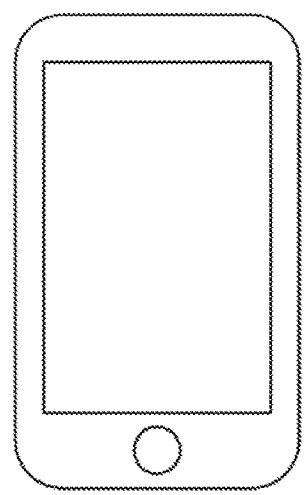
FIG. 12 is a schematic structural diagram of a display device according to an embodiment of the disclosure.

An embodiment of the disclosure further provides a display device as illustrated in FIG. 12, which includes the gate driver circuit according to the embodiments of the disclosure. The display device addresses the problem under a similar principle to the shift register above, so reference can be made to the implementations of the shift register above for an implementation of the display device, and a repeated description thereof will be omitted here.

In an embodiment, the display device above according to the embodiments of the disclosure may be an organic light-emitting display device, or may be a liquid crystal display device.

In the organic light-emitting display device, typically a plurality of organic light-emitting diodes, and a pixel compensation circuit connected with the respective organic light-emitting diodes are arranged. Typically the pixel compensation circuit is arranged therein with light-emission control transistors configured to control the organic light-emitting diodes to emit light, and scan control transistors configured to control data signals to be input. The gate driver circuit according to the embodiments of the disclosure above may be applied to provision of a light-emission control signal of the light-emission control transistor, or to provision of a gate scan signal of the scan control transistor, although the embodiments of the disclosure will not be limited thereto.

In the liquid crystal display device, typically a plurality of pixel electrodes, and switching transistors connected with the respective pixel electrodes are arranged. The gate driver circuit according to the embodiments of the disclosure above may be applied to provision of gate driver signals of the switching transistors.

In an embodiment, the display device above according to the embodiments of the disclosure can be a mobile phone, a tablet computer, a TV set, a display, a notebook computer, a digital photo frame, a navigator, and any other product or component capable of displaying. All the other dispensable components to the display device will be obvious to those ordinarily skilled in the art, so a repeated description thereof will be omitted here, and the embodiments of the disclosure will not be limited thereto.

In an embodiment, the shift register includes: the first input module configured to be controlled by the first clock signal terminal to transmit the input signal input at the input signal terminal to the first node; the second input module configured to be controlled by the input signal terminal to connect the first clock signal terminal with the second node; the first control module configured to be controlled by the second node to connect the second clock signal terminal with the third node; the second control module configured to be controlled by the first node and the second clock signal terminal to connect the second clock signal terminal or the first node with the fourth node; the third control module configured to be controlled by the third node to connect the first reference signal terminal with the fourth node; the output module configured to be controlled by the third node and the fourth node to connect the first reference signal terminal or the second reference signal terminal with the output signal terminal; the first capacitor configured to stabilize the electric potential of the second node; the second capacitor configured to stabilize the electric potential of the first node; the third capacitor configured to stabilize the electric potential of the third node; and the fourth capacitor configured to stabilize the electric potential of the fourth node. The shift register can take a high/low-level trigger signal as an input signal, and shift an output signal flexibly, and can have output signals overlap with each other, and the shift register can operate as either a scan driver circuit or a light-emission driver circuit for its high applicability to a number of driver modes. With the two clock signals, the electric potentials are rewritten respectively into the third node and the fourth node at an interval of half a cycle, and the electric potentials of the nodes are maintained by the capacitors in the other period of time, so that an output waveform can be output in a stable manner, and the shift register can operate in a stable manner; and with the two clock signals, there is a larger process window, thus enabling a normal output despite serious threshold drifting.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

What is claimed is:

1. A shift register, comprising a first input module, a second input module, a first control module, a second control module, a third control module, an output module, a first coupling module, a second coupling module, a third coupling module, and a fourth coupling module, wherein:

the first input module is electrically connected with an input signal terminal and a first clock signal terminal, and configured to be controlled by the first clock signal terminal to transmit an input signal to a first node;

the second input module is electrically connected with the input signal terminal and the first clock signal terminal, and configured to be controlled by the input signal terminal to transmit a first clock signal input at the first clock signal terminal to a second node;

the first control module is electrically connected with a second clock signal terminal, and configured to be controlled by the second node to transmit a second clock signal input at the second clock signal terminal to a third node;

the second control module is electrically connected with the second clock signal terminal, and configured to be controlled by both the first node and the second clock signal terminal to transmit either the second clock signal input at the second clock signal terminal or electric potential of the first node to a fourth node;

the third control module is electrically connected with a first reference signal terminal, and configured to be controlled by the third node to transmit a first reference signal input at the first reference signal terminal to the fourth node;

the output module is electrically connected with the first reference signal terminal, a second reference signal terminal, and an output signal terminal, and configured to be controlled by both the third node and the fourth node to transmit either the first reference signal input at the first reference signal terminal or a second reference signal input at the second reference signal terminal to the output signal terminal;

the first coupling module comprises a first capacitor electrically connected with the second node, and configured to stabilize electric potential of the second node;

the second coupling module comprises a second capacitor electrically connected with the first node and the second control module, and configured to stabilize the electric potential of the first node;

the third coupling module comprises a third capacitor electrically connected with the third node and the first reference signal terminal, and configured to stabilize electric potential of the third node; and the fourth coupling module comprises a fourth capacitor electrically connected with the fourth node and the second reference signal terminal, and configured to stabilize electric potential of the fourth node.

2. The shift register according to claim 1, wherein the first input module comprises a first switching transistor with a gate electrically connected with the first clock signal terminal, a source electrically connected with the input signal terminal, and a drain electrically connected with the first node.

3. The shift register according to claim 1, wherein the second input module comprises a second switching transistor with a gate electrically connected with the input signal terminal, a source electrically connected with the first clock signal terminal, and a drain electrically connected with the second node.

4. The shift register according to claim 1, wherein the first control module comprises a third switching transistor with a gate electrically connected with the second node, a source electrically connected with the second clock signal terminal, and a drain electrically connected with the third node.

5. The shift register according to claim 1, wherein the second control module comprises a fourth switching transistor and a fifth switching transistor, wherein:

the fourth switching transistor has a gate electrically connected with the first node, a source electrically connected with the second clock signal terminal and a gate of the fifth switching transistor, and a drain electrically connected with a first electrode of the second capacitor, and a source of the fifth switching transistor;

the fifth switching transistor has a drain electrically connected with the fourth node; and the second capacitor has a second electrode electrically connected with the first node.

6. The shift register according to claim 1, wherein the third control module comprises a sixth switching transistor with a gate electrically connected with the third node, a source electrically connected with the first reference signal terminal, and a drain electrically connected with the fourth node.

7. The shift register according to claim 1, wherein the output module comprises a seventh switching transistor and an eighth switching transistor, wherein:

the seventh switching transistor has a gate electrically connected with the third node, a source electrically connected with the first reference signal terminal, and a drain electrically connected with a drain of the eighth transistor, and the output signal terminal; and the eighth transistor has a gate electrically connected with the fourth node, and a source electrically connected with the second reference signal terminal.

8. The shift register according to claim 1, wherein the first capacitor has a first electrode electrically connected with the second node, and a second electrode electrically connected with the second clock signal terminal.

9. The shift register according to claim 8, wherein the shift register further comprises a fourth control module, wherein:

the fourth control module is electrically connected with the first reference signal terminal, and configured to be controlled by the fourth node to transmit the first reference signal input at the first reference signal terminal to the third node.

10. The shift register according to claim 9, wherein the fourth control module comprises a ninth switching transistor with a gate electrically connected with the fourth node, a source electrically connected with the first reference signal terminal, and a drain electrically connected with the third node.

11. The shift register according to claim 9, wherein the shift register further comprises a tenth switching transistor with a gate electrically connected with the second reference signal terminal, a source electrically connected with the second control module, the third control module, and the fourth control module, and a drain electrically connected with the fourth node.

12. The shift register according to claim 10, wherein the shift register further comprises a tenth switching transistor with a gate electrically connected with the second reference signal terminal, a source electrically connected with the second control module, the third control module, and the fourth control module, and a drain electrically connected with the fourth node.

13. The shift register according to claim 1, wherein the shift register further comprises a fifth control module;

the first capacitor has a first electrode electrically connected with the second node, and a second electrode electrically connected with the third node; and the fifth control module is electrically connected with the first clock signal terminal and the second reference signal terminal, and configured to be controlled by the first clock signal terminal to transmit the second reference signal input at the second reference signal terminal to the second node.

14. The shift register according to claim 13, wherein the fifth control module comprises an eleventh switching transistor with a gate electrically connected with the first clock signal terminal, a source electrically connected with the second reference signal terminal, and a drain electrically connected with the second node.

15. A method for driving the shift register according to claim 1, the method comprising:

a first stage of providing the input signal terminal and the first clock signal terminal with a first level signal, and the second clock signal terminal with a second level signal, and outputting the second level signal at the output signal terminal;

a second stage of providing the input signal terminal and the second clock signal terminal with the first level signal, and the first clock signal terminal with the second level signal, and outputting the first level signal at the output signal terminal;

a third stage of providing the input signal terminal and the second clock signal terminal with the second level signal, and the first clock signal terminal with the first level signal, and outputting the first level signal at the output signal terminal;

a fourth stage of providing the input signal terminal and the first clock signal terminal with the second level signal, and the second clock signal terminal with the first level signal, and outputting the second level signal at the output signal terminal; and a fifth stage of providing the input signal terminal and the second clock signal terminal with the second level signal, and the first clock signal terminal with the first level signal, and outputting the second level signal at the output signal terminal.

16. A method for driving the shift register according to claim 1, the method comprising:
- a first stage of providing the first clock signal terminal with a first level signal, and the input signal terminal and the second clock signal terminal with a second level signal, and outputting the first level signal at the output signal terminal;
- a second stage of providing the second clock signal terminal with the first level signal, and the input signal terminal and the first clock signal terminal with the second level signal, and outputting the second level signal at the output signal terminal;
- a third stage of providing the second clock signal terminal with the second level signal, and the input signal terminal and the first clock signal terminal with the first level signal, and outputting the second level signal at the output signal terminal;
- a fourth stage of providing the first clock signal terminal with the second level signal, and the input signal terminal and the second clock signal terminal with the first level signal, and outputting the first level signal at the output signal terminal; and
- a fifth stage of providing the second clock signal terminal with the second level signal, and the input signal terminal and the first clock signal terminal with the first level signal, and outputting the first level signal at the output signal terminal.

* * * * *